(12) United States Patent
Jameson, III et al.

(10) Patent No.: US 9,818,939 B2
(45) Date of Patent: Nov. 14, 2017

(54) RESISTIVE SWITCHING DEVICES HAVING A SWITCHING LAYER AND AN INTERMEDIATE ELECTRODE LAYER AND METHODS OF FORMATION THEREOF

(71) Applicant: Adesto Technologies Corporation, Sunnyvale, CA (US)

(72) Inventors: John R. Jameson, III, Menlo Park, CA (US); John E. Sanchez, Palo Alto, CA (US); Wei Ti Lee, San Jose, CA (US); Yi Ma, Santa Clara, CA (US); Venkatesh P. Gopinath, Fremont, CA (US); Foroozan Sarah Koushan, San Jose, CA (US)

(73) Assignee: ADESTO TECHNOLOGIES CORPORATION, Sunnyvale, CA (US)

( * ) Notice: Subject to any disclaimer, the term of this patent is extended or adjusted under 35 U.S.C. 154(b) by 0 days.

(21) Appl. No.: 14/990,550

(22) Filed: Jan. 7, 2016

(65) Prior Publication Data

US 2016/0118585 A1    Apr. 28, 2016

Related U.S. Application Data

(62) Division of application No. 13/829,941, filed on Mar. 14, 2013, now Pat. No. 9,252,359.

(60) Provisional application No. 61/771,930, filed on Mar. 3, 2013.

(51) Int. Cl.
*H01L 21/20* (2006.01)
*H01L 45/00* (2006.01)
*H01L 27/24* (2006.01)

(52) U.S. Cl.
CPC .......... *H01L 45/1625* (2013.01); *H01L 45/08* (2013.01); *H01L 45/1233* (2013.01); *H01L 45/1253* (2013.01); *H01L 45/146* (2013.01); *H01L 45/16* (2013.01); *H01L 45/165* (2013.01);
(Continued)

(58) Field of Classification Search
CPC .. H01L 45/1233; H01L 45/143; H01L 45/144
See application file for complete search history.

(56) References Cited

U.S. PATENT DOCUMENTS

| | | |
|---|---|---|
| 3,480,843 A | 11/1969 | Richardson |
| 5,798,903 A | 8/1998 | Dhote et al. |
| 6,063,692 A | 5/2000 | Lee et al. |

(Continued)

FOREIGN PATENT DOCUMENTS

| | | |
|---|---|---|
| CN | 101233625 A | 7/2008 |
| WO | 2016057508 A1 | 4/2016 |

OTHER PUBLICATIONS

Aratani, K, et al. "A Novel Resistance Memory with High Scalability and Nanosecond Switching," IEEE 2007, pp. 783-786.

(Continued)

*Primary Examiner* — Zandra Smith
*Assistant Examiner* — John M Parker
(74) *Attorney, Agent, or Firm* — Slater Matsil, LLP

(57) ABSTRACT

In one embodiment of the present invention, a resistive switching device includes a first electrode disposed over a substrate and coupled to a first potential node, a switching layer disposed over the first electrode, a conductive amorphous layer disposed over the switching layer, and a second electrode disposed on the conductive amorphous layer and coupled to a second potential node.

27 Claims, 27 Drawing Sheets

(52) U.S. Cl.
CPC ...... *H01L 27/2409* (2013.01); *H01L 27/2463* (2013.01)

(56) References Cited

U.S. PATENT DOCUMENTS

| | | | |
|---|---|---|---|
| 7,602,042 | B2 | 10/2009 | Ahn et al. |
| 7,728,322 | B2 | 6/2010 | Kozicki |
| 7,851,777 | B2 | 12/2010 | Arai et al. |
| 8,022,384 | B2 | 9/2011 | Kozicki |
| 8,134,129 | B2 | 3/2012 | Tokanai et al. |
| 8,134,139 | B2 | 3/2012 | Lin et al. |
| 8,610,102 | B2 | 12/2013 | Kawashima et al. |
| 8,884,397 | B2 | 11/2014 | Aratani et al. |
| 8,907,313 | B2 | 12/2014 | Barabash et al. |
| 2005/0226036 | A1 | 10/2005 | Aratani et al. |
| 2006/0011910 | A1 | 1/2006 | Campbell |
| 2006/0081920 | A1 | 4/2006 | Ufert |
| 2006/0091476 | A1 | 5/2006 | Pinnow et al. |
| 2006/0172067 | A1 | 8/2006 | Ovshinsky et al. |
| 2007/0034851 | A1* | 2/2007 | Kostylev ............... H01L 45/06 257/4 |
| 2007/0158633 | A1* | 7/2007 | Lai ........................ H01L 45/06 257/4 |
| 2007/0161186 | A1 | 7/2007 | Ho |
| 2008/0073751 | A1 | 3/2008 | Bruchhaus |
| 2009/0085025 | A1 | 4/2009 | Arai et al. |
| 2009/0166601 | A1 | 7/2009 | Czubatyj et al. |
| 2010/0012917 | A1 | 1/2010 | Takaura et al. |
| 2010/0059729 | A1 | 3/2010 | Hudgens |
| 2010/0133496 | A1 | 6/2010 | Lee et al. |
| 2010/0187493 | A1 | 7/2010 | Takahashi |
| 2010/0252798 | A1 | 10/2010 | Sumino |
| 2010/0258781 | A1 | 10/2010 | Phatak et al. |
| 2010/0258782 | A1 | 10/2010 | Kuse et al. |
| 2011/0073825 | A1 | 3/2011 | Aratani et al. |
| 2011/0155988 | A1 | 6/2011 | Ohba et al. |
| 2011/0194329 | A1 | 8/2011 | Ohba et al. |
| 2012/0025164 | A1 | 2/2012 | Deweerd et al. |
| 2012/0074374 | A1 | 3/2012 | Jo |
| 2012/0119332 | A1 | 5/2012 | Atanackovic |
| 2012/0236625 | A1 | 9/2012 | Ohba et al. |
| 2012/0264272 | A1 | 10/2012 | Sills et al. |
| 2012/0276725 | A1 | 11/2012 | Imonigie et al. |
| 2013/0062587 | A1 | 3/2013 | Lee et al. |
| 2013/0221307 | A1 | 8/2013 | Wang et al. |
| 2013/0256622 | A1 | 10/2013 | Sei et al. |
| 2014/0151621 | A1 | 6/2014 | Tendulkar et al. |
| 2014/0166958 | A1 | 6/2014 | Barabash et al. |

OTHER PUBLICATIONS

Cabral, C. et al. "Irreversible modification of GE2Sb2Te5 phase change material by nanometer-thin Ti adhesion layers in a device-compatible stack," Applied Physics Letter 90, 051908, Jan. 30, 2007, 3 pages.

Chen, A., "Status and Challenges in Ionic Memories," Strategic Technology Group, AMD, Presentation, Nov. 2008, Advanced Micro Devices, Inc, 34 pages.

Kingon, et al., "Alternative Dielectrics to Silicon Dioxide for Memory and Logic Devices," Department of Material Science and Engineering, North State University, Nature, vol. 406, Aug. 2000, Macmillan Magazines Ltd, pp. 1032-1038.

Lee, M.H. et al., "WOx-based Transition Metal Oxide (TMO) ReRAM and Cu-based Conducting Bridge Memory (CB-ReRAM)," Mavronix International Co., Ltd., 2010, 41 pages.

Lin, Y., et al., "A Model for the RESET Operation of Electrochemical Conducting Bridge Resistive Memory (CB-ReRAM)," IEEE 2010, 4 pages.

Lin, Y., et al., "A Novel TiTe Buffered Cu—GeSbTe/SiO2 Electrochemical Resistive Memory (ReRAM)," Symposium on VLSI Technology Digest of Technical Papers, IEEE 2010, pp. 91-92.

Valov, et al., "Electrochemical Metallization Memories-Fundamentals, Applications, Prospects," Topical Review, Nanotechnology 22 254003, May 2011, IOP Publishing Ltd., pp. 1-22.

Waser, "Resistive Non-Volatile Memory Deivces (Invited Papers)," ScienceDirect, Microelectronic Engineering 86, Mar. 2009, Elsevier B.V., pp. 1925-1928.

Wong, "Emergin Memories," Department of Electrical Engineering, Stanford University, Presentation, Apr. 2008, 77 pages.

Wong, et al., "Phase Change Memory," Proceedings of the IEEE, vol. 98, No. 12, Dec. 2010, pp. 2201-2227.

Nicolet, M., et al., "Highly metastable amorphous or near-amorphous ternary films (mictamict alloys)," Microelectronic Engineering, vol. 55, Issue 1-4, Mar. 2001, 357-367 pages, Elsevier.

Reid, J., "Amorphous Ternary Diffusion Barriers for Silicon Metallizations," May 9, 1995, 202 pages.

Cabral, C. et al. "Irreversible modification of GE2Sb2Te5 phase change material by nanometer-thin Ti adhesion layers in a device-compatible stack," Applied Physics Letter 90, 051908, Jan. 30, 2007, 3 pgs.

International Search Report of Patent Cooperation Treaty (PCT), International Application No. PCT/US2014/011146, Applicant: Adesto Technologies Corporation, dated May 2, 2014, 9 pages.

International Search Report and Written Opinion of Patent Cooperation Treaty (PCT), International Application No. PCT/US14/30871, Applicant: Adesto Technologies Corporation, dated Aug. 27, 2014, 10 pages.

PCT International Search Report for International Application No. PCT/US14/20034, dated Mar. 10, 2015.

Lin, Y., et al., "A Model for the Reset Operation of Electrochemical Conducting Bridge Resistive Memory (CB-ReRAM)," IEEE 2010, 4 pgs.

Valov, et al., "Electrochemical Meetalization Memories-Fundamentals, Applications, Prospects," Topical Review, Nanotechnology 22 254003, May 2011, IOP Publishing Ltd., pp. 1-22.

Wong, et al., "Phase Change Memory," Proceedings of the IEEE, vol. 98, No. 12, Dec. 2010, pp. 2201-2227.

Fluck, E., "New Notations in the Periodic Table," Inorganic Chemistry Division, 1988, Pure & Appl. Chem., vol. 60, No. 3, pp. 431-436.

International Union of Pure and Applied Chemistry, "IUPAC Periodic Table of the Elements," Jan. 8, 2016, 1 page.

Wikipedia, "Periodic Table," https://en.wikipedia.org/w/index.php?title=Periodic_table&oldid=779909875, May 11, 2017, 22 pages.

* cited by examiner

US 9,818,939 B2

RESISTIVE SWITCHING DEVICES HAVING A SWITCHING LAYER AND AN INTERMEDIATE ELECTRODE LAYER AND METHODS OF FORMATION THEREOF

This application is a Divisional application of application Ser. No. 13/829,941 filed on Mar. 14, 2013, which claims the benefit of U.S. Provisional Application No. 61/771,930, filed on Mar. 3, 2013, entitled "Memory Elements, Memory Cells, Circuits Including The Same, And Corresponding Methods." All the above applications are hereby incorporated herein by reference.

TECHNICAL FIELD

The present invention relates generally to switching devices, and more particularly to resistive switching devices having a switching layer and an intermediate electrode layer and methods of formation thereof.

BACKGROUND

Semiconductor industry relies on device scaling to deliver improved performance at lower costs. Flash memory is the mainstream non-volatile memory in today's market. However, Flash memory has a number of limitations that is posing a significant threat to continued advancement of memory technology. Therefore, the industry is exploring alternative memories to replace Flash memory. Contenders for future memory technology include magnetic storage random access memory (MRAM), ferroelectric RAM (Fe-RAM), and resistive switching memories such as phase change RAM (PCRAM), metal oxide based memories, and ionic memories such as conductive bridging random access memory (CBRAM) or programmable metallization cell (PMC) memory. These memories are also called as emerging memories. However, many innovations are needed in these emerging memories to make a viable alternative memory.

SUMMARY OF THE INVENTION

In accordance with an embodiment of the present invention, a resistive switching device comprises a first electrode disposed over a substrate and coupled to a first potential node, a switching layer disposed over the first electrode, a conductive amorphous layer disposed over the switching layer, and a second electrode disposed on the conductive amorphous layer and coupled to a second potential node.

In accordance with an alternative embodiment of the present invention, a resistive switching device comprises a first electrode disposed over a substrate and coupled to a first potential node, and a oxide switching layer disposed over the first electrode. The oxide switching layer comprises less than 0.01% of copper and silver. The resistive switching device further comprises a second electrode disposed on the oxide switching layer and coupled to a second potential node, and an interface between the oxide switching layer and the second electrode. The interface comprises tellurium and the second electrode comprises less than 5% of copper and silver.

In accordance with an alternative embodiment of the present invention, a metal oxide resistive switching device comprises a first electrode coupled to a first potential node, a metal oxide layer disposed over the first electrode, and a tellurium layer disposed over and contacting the metal oxide layer. The tellurium layer comprises less than 0.01% of copper and silver. A second electrode is disposed over and contacting the tellurium layer. The second electrode is coupled to a second potential node. The second electrode comprises less than 5% of copper and silver.

In accordance with an alternative embodiment of the present invention, a method of forming a resistive switching device comprises forming a first insulating layer over a substrate, forming a first electrode in the first insulating layer, and forming a metal oxide layer over the first electrode. A tellurium layer is formed over and contacts the metal oxide layer. The tellurium layer comprises less than 0.01% of copper and silver. The method further comprises forming a second electrode over the tellurium layer. The second electrode contacts the tellurium layer. The second electrode is coupled to a second potential node.

In accordance with an alternative embodiment of the present invention, a memory cell comprises an access device having a first terminal and a second terminal coupled to a first potential node, and a resistive switching memory device. The access device is disposed in or over a substrate. The resistive switching memory device comprises a first electrode disposed over the substrate and coupled to the first terminal, and a switching layer disposed over the first electrode. The switching layer comprises less than 0.01% of copper and silver. A first conductive layer is disposed over the switching layer. The first conductive layer comprises tellurium and the first conductive layer comprises less than 0.01% of copper and silver. A second electrode is disposed on the first conductive layer and coupled to a second potential node, wherein the second electrode comprises less than 5% of copper and silver.

BRIEF DESCRIPTION OF THE DRAWINGS

For a more complete understanding of the present invention, and the advantages thereof, reference is now made to the following descriptions taken in conjunction with the accompanying drawing, in which:

FIG. 1, which includes FIGS. 1A-1C, illustrates a resistive switching device in accordance with an embodiment of the invention, wherein FIG. 1A illustrates a cross-sectional view and FIGS. 1B and 1C illustrate operation of the resistive switching device;

FIG. 6, which includes

FIG. 7, which includes

FIG. 8, which includes

FIG. 9, which includes

FIG. 10, which includes FIGS. 10A and 10B, illustrates a cross-point device array in accordance with embodiments of the present invention, wherein FIG. 10A illustrates a top view and FIG. 10B illustrates a cross-sectional view;

FIG. 11, which includes FIGS. 11A and 11B, illustrates various memory cell array implementing embodiments of the invention, wherein FIG. 11A illustrates a memory cell and FIG. 11B illustrates a memory array comprising the memory cell.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of various embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1A:
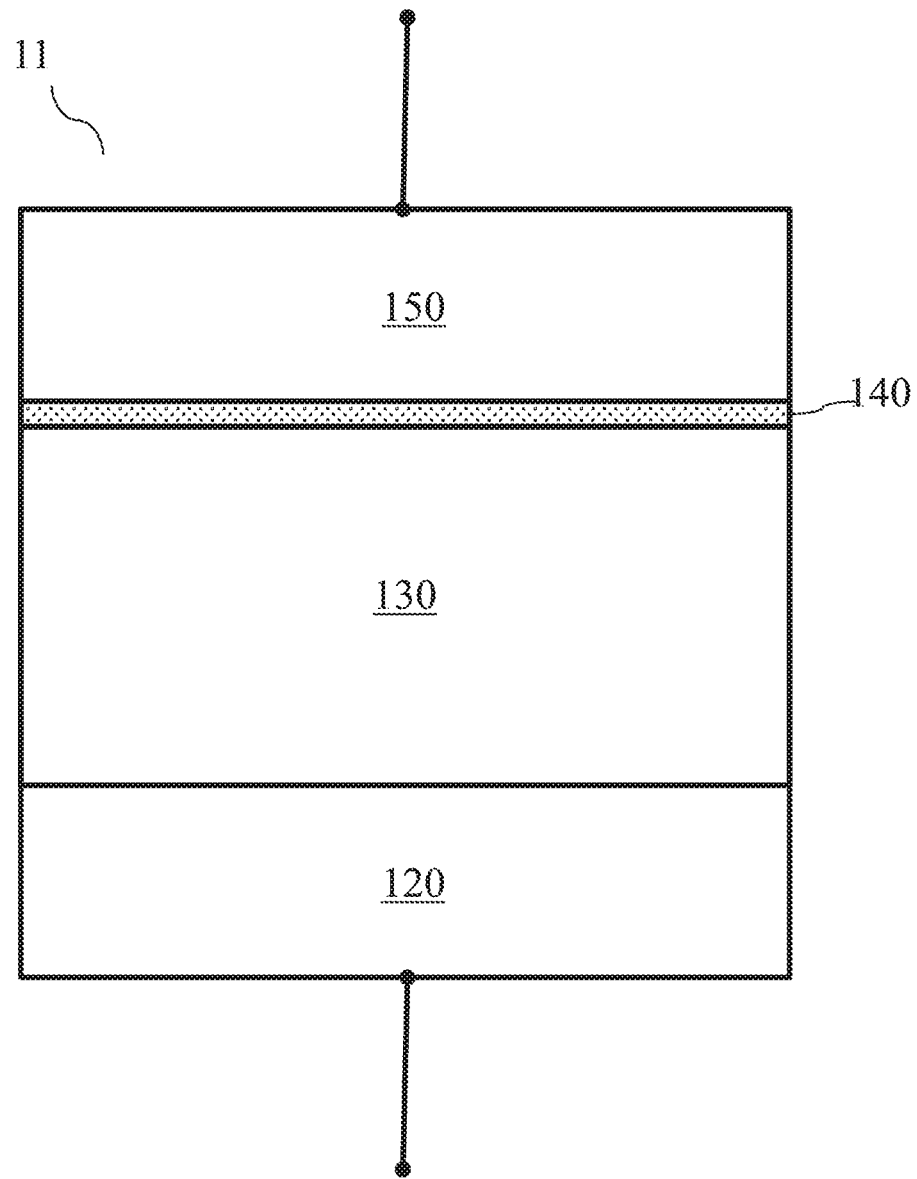
Figure 1B:
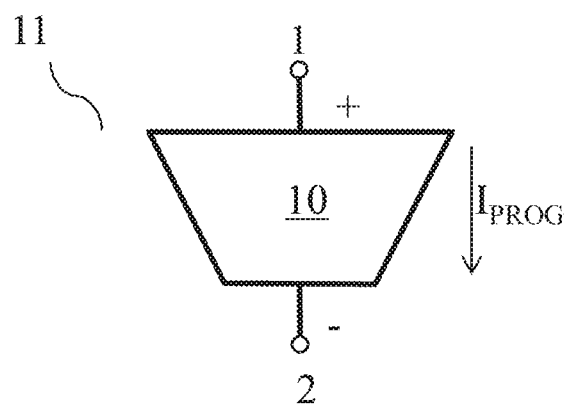
Figure 1C:
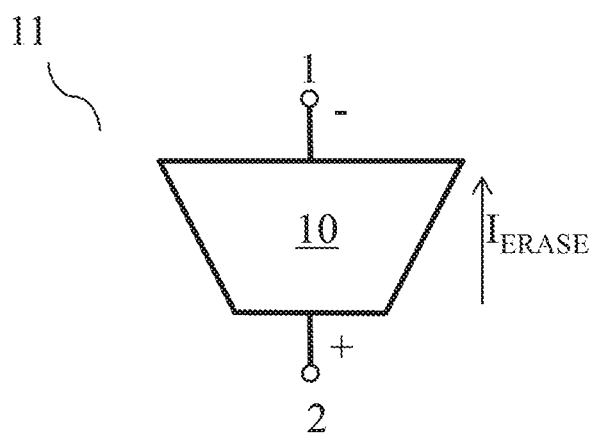

FIG. 1, which includes FIGS. 1A-1C, illustrates a resistive switching device in accordance with an embodiment of the invention, wherein FIG. 1A illustrates a cross-sectional view and FIGS. 1B and 1C illustrate operation of the resistive switching device.

In various embodiments, the resistive switching device 11 comprises a first electrode layer 120, a switching layer 130, an intermediate electrode layer 140, and a second electrode layer 150. The first electrode layer 120 may be an inert electrode and may be enclosed within a diffusion barrier/adhesion promoting layer. In various embodiments, the first electrode layer 120 may comprise tungsten, platinum, ruthenium, tantalum, titanium nitride, tantalum nitride, titanium tungsten (TiW), molybdenum, gold, nickel, cobalt, iridium, and combinations thereof, and such others. In other embodiments, the first electrode 120 may comprise a conductive oxide, such as indium tin oxide, tungsten oxide, titanium oxide, or others. In still other embodiments, the first electrode 120 may comprise a conductive polymer. In still other embodiments, the first electrode 120 may comprise a metal silicide, such as tungsten silicide.

In one embodiment, the switching layer 130 may comprise metal oxides. The switching layer 130 may comprise a transition metal oxide such as hafnium oxide, zirconium oxide, titanium oxide, tungsten oxide, or others. In an alternative embodiment, the switching layer 130 may comprise a rare earth metal oxide such as gadolinium oxide, yttrium oxide, erbium oxide, terbium oxide, ytterbium oxide. In another embodiment, the switching layer 130 may comprise a metal oxide such as aluminum oxide. In one embodiment, the switching layer 130 may comprise a non-metal oxide such as silicon oxide. The switching layer 130 may not include electrochemical elements such as copper, silver, gold, or zinc in one or more embodiments. In one or more embodiments, the switching layer 130 comprises less than 0.01% of copper, silver, gold, and zinc.

In other embodiments, the switching layer 130 may comprise an inorganic insulator. In still other embodiments, the switching layer 130 may comprise a chalcogenide material such as germanium sulfide, germanium selenide, or germanium telluride, which may not be phase change materials. In further embodiments, the switching layer 130 may comprise a high-k dielectric layer such as a nitrided hafnium silicate or hafnium silicon oxynitride (HfSiON), silicates such as hafnium silicate (HfSiO$_4$), and others. In still other embodiments, the switching layer 130 may comprise an organic layer such as amorphous carbon.

The resistive switching device further comprises an intermediate electrode layer 140 disposed over and contacting the switching layer 130. The switching layer 130 may change conductance due to the interaction with the intermediate electrode layer 140 when an electric field is applied in various embodiments. However, in various embodiments, the switching layer 130 is not a phase change alloy (crystalline to amorphous or vice versa) and therefore does not require heating (or cooling) electrodes for phase transformation.

A second electrode layer 150 is disposed over and contacts the intermediate electrode layer 140. In various embodiments, the second electrode layer 150 may comprise tungsten, platinum, ruthenium, tantalum, titanium nitride, tantalum nitride, titanium tungsten (TiW), molybdenum, gold, nickel, cobalt, iridium, and combinations thereof, and such others.

In one embodiment, the switching layer 130 comprises gadolinium oxide, the intermediate electrode layer 140 comprises titanium telluride, and the second electrode layer 150 comprises titanium nitride. In another specific embodiment, the switching layer 130 may comprise aluminum oxide, the intermediate electrode layer 140 may comprise titanium telluride, and the second electrode layer 150 may comprise titanium nitride.

In one embodiment, the intermediate electrode layer 140 comprises a conductive amorphous layer. An amorphous layer may be used to improve uniformity in various embodiments. For example, a thin polycrystalline layer may have only a small number of grains. Variations in the location of the grain boundary, grain size distribution, shape of the grains, variations in segregation of various atoms at the ground boundary relative to the grain, and others may result in variations in the electrical properties of the switching action. In contrast, an amorphous layer may produce a consistent electrical functionality. There may be additional electrical advantages as well to using an amorphous layer. The intermediate electrode layer 140 may comprise titanium and tellurium in an amorphous state. In particular, the intermediate electrode layer 140 may not have a particular phase having a distinctive crystal structure and lattice spacing.

The intermediate electrode layer 140 and the second electrode layer 150 may not include electrochemical elements such as copper, silver, gold, or zinc in one more embodiments. In one or more embodiments, the switching layer 130, the intermediate electrode layer 140 and the second electrode layer 150 comprise insignificant amounts of copper, silver, gold, or zinc so that they do not contribute to or impede electrical functionality. In one or more embodiments, the switching layer 130 and the intermediate electrode layer 140 comprise less than 0.01% of copper, silver, gold, and zinc, and less than 0.001% in one embodiment. Accordingly, this may be less than 1 ppm in another embodiment, and 0.1 ppm to 1000 ppm in another alternative. In one or more embodiments, the second electrode layer 150 comprise less than 5% of copper, silver, gold, and zinc, and less than 1% in one embodiment.

The operation of the resistive switching device 11 is described using FIGS. 1B and 1C.

The resistive switching device 11 may have at least two resistive states. The state of the resistive switching device 11 may modulate with the resistance of the switching layer 130 and/or the intermediate electrode 140. For example, after a program operation, the switching layer 130 may have a low resistance (ON state) whereas after an erase operation, the switching layer 130 may have a high resistance (OFF state).

The programming operation may be accomplished using a static voltage or a dynamic pulse. Typically programming is performed using a programming pulse, which applies a potential difference between the first node 1 and the second node 2.

Referring to FIG. 1B, the operation of the memory cell involves nano-scale migration and rearrangement of atoms or other defects. As an illustration, when a positive voltage is applied across the first and the second nodes 1 and 2 as illustrated in FIG. 1B, atoms or other defects having a positive charge (ions) may be moved towards the negative electrode due to the electric field in the switching layer 130 resulting in the flow of a program current. Alternatively, atoms or other defects having a negative charge (ions) may be moved towards the positive electrode.

Depending on the extent of this rearrangement of atoms or defects, the rearrangement may be quasi-stable, i.e., the atoms or other defects may not return back when the potential is removed. This may result in a change in the conductance of the switching layer 130 even after the program voltage is removed. Such a change in behavior of the switching layer 130 may be measured by applying a read potential across the first and the second nodes 1 and 2. Thus, the resistive switching device may be used as a non-volatile memory. In contrast, if the change in the conductance of the switching layer 130 is temporary, i.e., the conductance returns to the neutral state immediately after the removal of the program voltage, then the resistive switching device may be used as a switching device, for example, an access device, a volatile memory device.

Similarly, as illustrated in FIG. 1C, the erase operation may be accomplished using a static voltage or a dynamic pulse. Typically erasure is performed using an erase pulse, which applies a potential difference (opposite to the program pulse) between the first node 1 and the second node 2. When a negative voltage higher than a threshold is applied across the first and the second nodes 1 and 2, the previous rearrangement of the atoms or other defects may be reversed, or at least modified so as to increase the resistance of the device.

Figure 2:
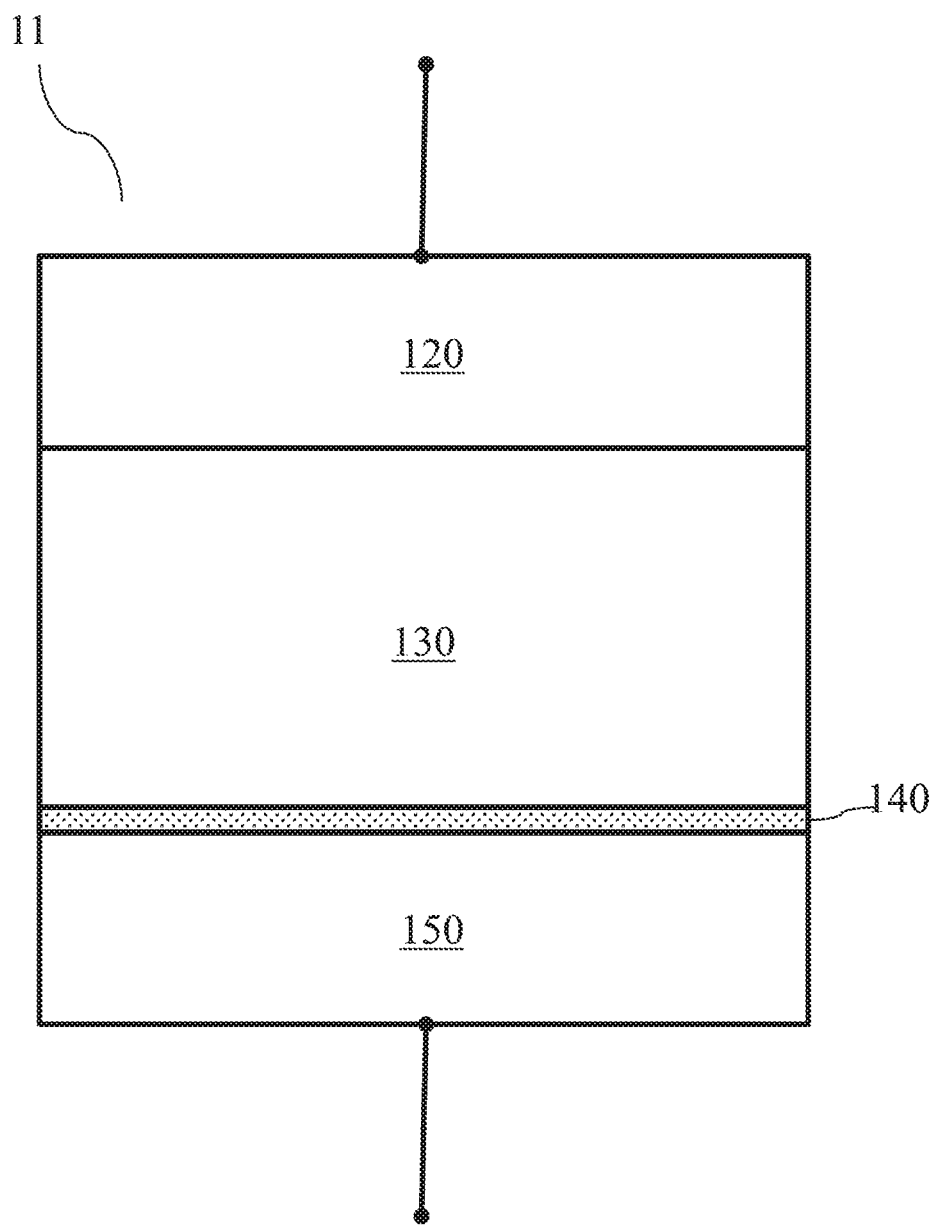
FIG. 2 illustrates a resistive switching device having a reverse structure in accordance with an embodiment of the invention.

FIG. 2 illustrates a resistive switching device having a reverse structure in accordance with an embodiment of the invention.

This embodiment is similar to FIG. 1 except that the order of the electrodes is reversed. In this embodiment, the second electrode layer 150 is disposed below the intermediate electrode layer 140, which is disposed below the switching layer 130. Accordingly, the first electrode layer 120 is at the top over the switching layer 130. The second electrode layer 150 is thus formed as the bottom electrode in this embodiment.

Figure 3:
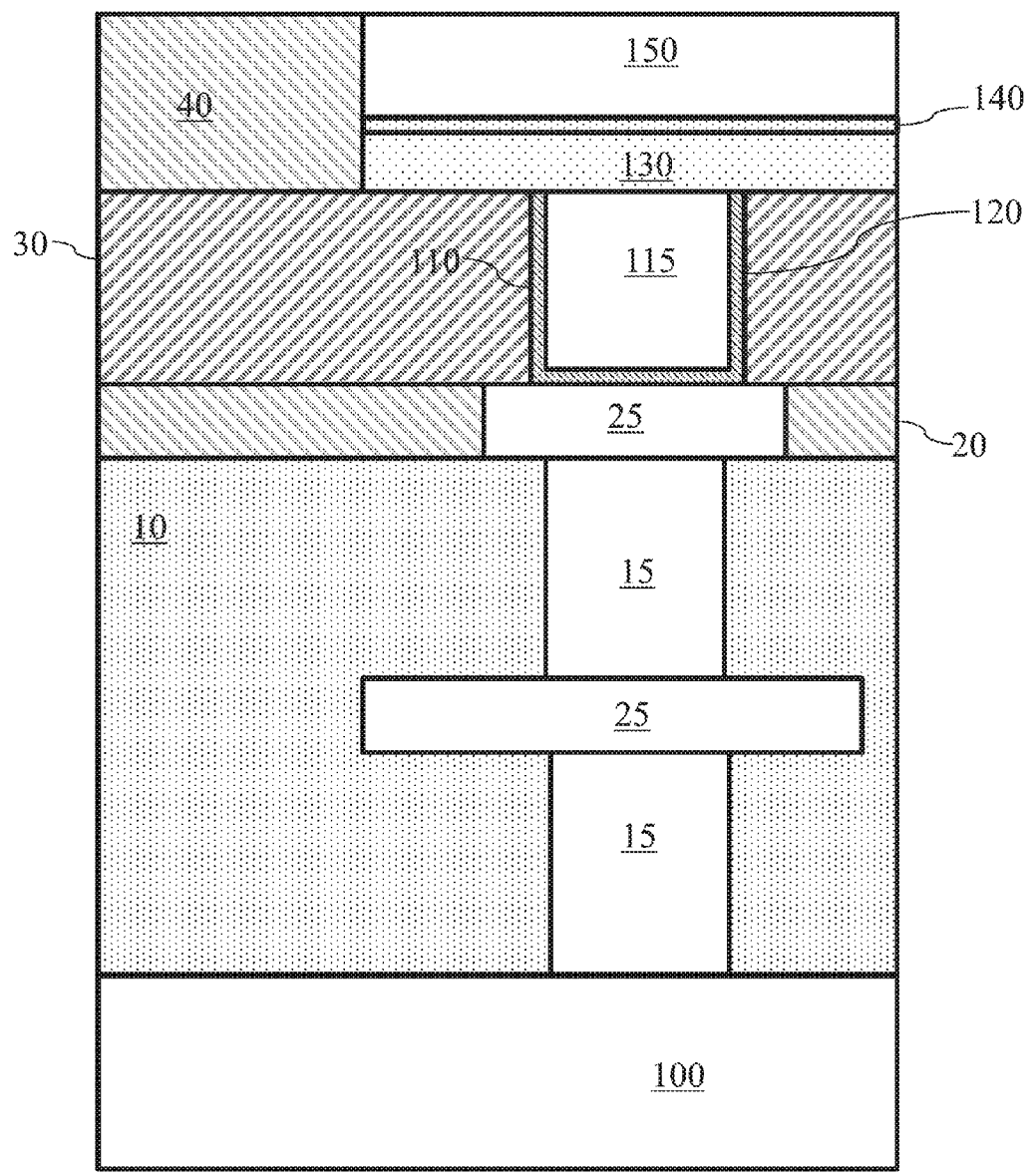
FIG. 3 illustrates a resistive switching device integrated over a semiconductor substrate in accordance with an embodiment of the invention.

FIG. 3 illustrates a resistive switching device integrated over a semiconductor substrate in accordance with an embodiment of the invention.

Referring to FIG. 3, a resistive switching device is disposed over a substrate 100. The resistive switching device is disposed within the metallization levels formed over the substrate 100. In various integration schemes, the location of the resistive switching device within the metallization layers may be different. As an example, in one embodiment, the resistive switching device may be formed over the first and the second metal levels.

As illustrated in FIG. 3, at least one of a plurality of metal lines 25 and at least one of a plurality of vias 15 are disposed within a first insulating layer 10 over a substrate 100 in one or more embodiments. The substrate 100 may comprise a bulk silicon substrate or a silicon-on-insulator substrate. In various embodiments, the substrate 100 may comprise Si, Ge, SiGe, GaN, or other semiconductor materials. In one or more embodiments, the substrate 100 may comprise any other suitable semiconductor, for example, within which an access device such as a transistor or a diode may be fabricated. In still other embodiments, the substrate 100 may comprise a plastic material.

In various embodiments, as described above, the resistive switching device comprises a first electrode layer 120, a switching layer 130, an intermediate electrode layer 140, a second electrode layer 150. The first electrode layer 120 may be coupled to a metal line of the plurality of metal lines 25 disposed within a second insulating layer 20. The second insulating layer 20 may be the same material as the first insulating layer 10 or may be a different dielectric material.

The first electrode layer 120 may comprise a barrier layer 110 and a fill material 115 disposed within the barrier layer 110. Together, the barrier layer 110 and the fill material 115 form the first electrode layer 120. In one embodiment, tungsten (W) may be used as the fill material 115. In another embodiment, tantalum (Ta) may be used as the fill material 115. In another embodiment, the fill material 115 may comprise an insulating material such as silicon dioxide or silicon nitride. In yet another embodiment, the fill material may comprise the intermediate electrode material as in the inverted cell structure of FIG. 2.

The barrier layer 110 is designed to prevent in-diffusion of metal atoms from the underlying metal line of the plurality of metal lines 25. Further, the barrier layer 110 may be configured to promote adhesion with the third insulating layer 30. In one embodiment, the barrier layer 110 may comprise tantalum nitride to prevent copper diffusion from the underlying metal line of the plurality of metal lines 25. In an alternative embodiment, the barrier layer 110 may comprise titanium nitride. In other embodiments, the barrier layer 110 may comprise ruthenium, tungsten nitride, and other suitable materials used as barrier in the semiconductor industry.

The first electrode layer 120 may be embedded within a third insulating layer 30 in one embodiment. The switching layer 130, the intermediate electrode layer 140, and the second electrode layer 150 may be formed within a fourth insulating layer 40 in one embodiment. In some embodiments, the fourth insulating layer 40 may comprise a plurality of layers and may include multiple etch stop liners separated by inter level dielectric layers. In an alternative embodiment, the switching layer 130, the intermediate electrode layer 140, and the second electrode layer 150 may be deposited as a blanket layer and the fourth insulating layer 40 may be deposited after patterning the blanket layers.

In various embodiments, the intermediate electrode layer 140 comprises an element such as tellurium or selenium. In further embodiments, the intermediate electrode layer 140 comprises tellurium and titanium. In one embodiment, the stoichiometry of tellurium and titanium is maintained to prevent the formation of titanium telluride crystals comparable to the thickness of the intermediate electrode layer 140. In other embodiment, the stoichiometry of the tellurium and titanium is maintained to prevent the formation of titanium telluride crystals much smaller than the thickness of the intermediate electrode layer 140. In still another even more specific embodiment, the stoichiometry of the tellurium and titanium is maintained to achieve an amorphous titanium telluride layer. In particular, the atomic percent of tellurium in the intermediate electrode layer 140 is between 25% to 67% in one embodiment, and 20% to 70% in another embodiment.

As a further illustration, to enhance the reactivity of the reactive element such as tellurium further, the intermediate electrode layer 140 is formed in an amorphous state. The lack of long range order enables the tellurium to interact with the switching layer 130 efficiently and minimizes the variations between different devices 11 formed on the same substrate 100.

Additionally, the thickness of the intermediate electrode layer 140 is controlled. For example, the thickness of the intermediate electrode layer 140 is less than 100 nm in or more embodiments. In one more embodiments, the thickness of the intermediate electrode layer 140 is about 2 nm to about 30 nm. Advantageously, this may also help to minimize defects in the second electrode layer 150.

Figure 4:
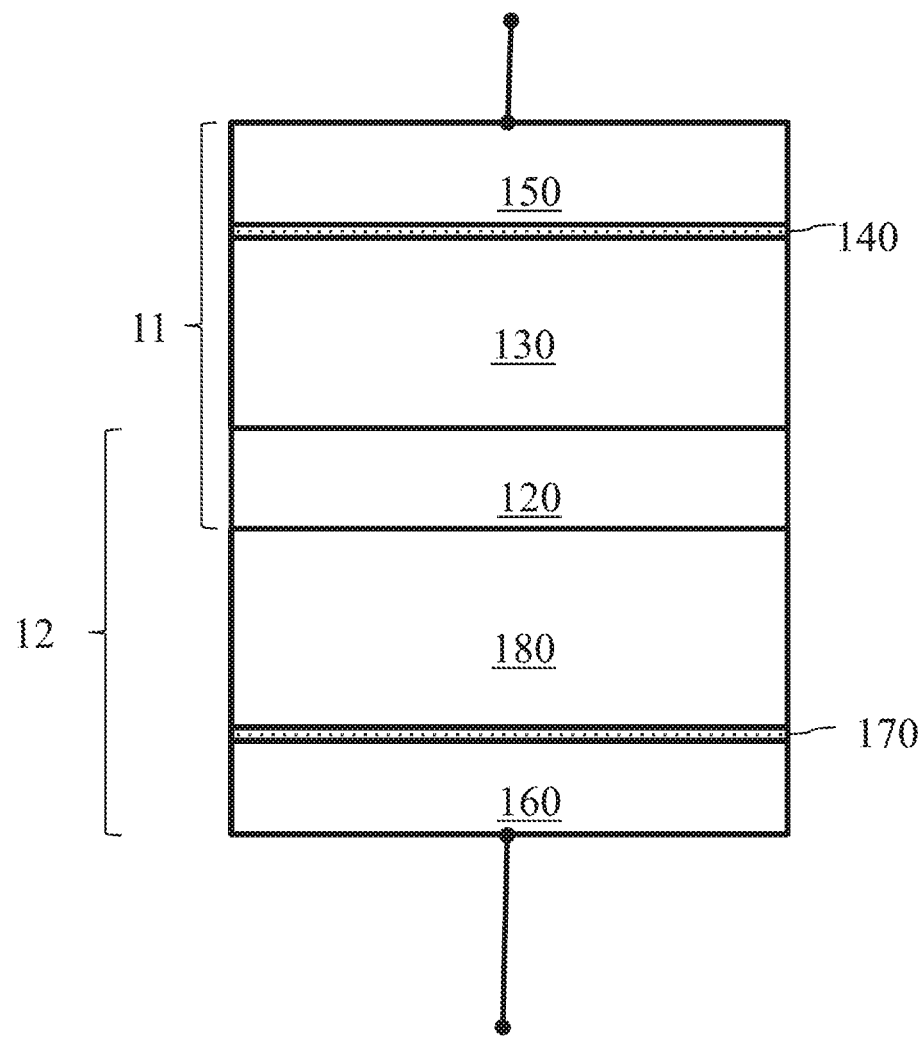
FIG. 4 illustrates a resistive switching device stack integrated over a semiconductor substrate in accordance with an embodiment of the invention.

FIG. 4 illustrates a resistive switching device integrated over a semiconductor substrate in accordance with an embodiment of the invention.

FIG. 4 illustrates two resistive switching devices coupled in anti-series in accordance with an embodiment of the invention. In one embodiment, a resistive switching device 11 is coupled to another resistive switching device 12 is anti-series. Accordingly, one of the two resistive switching devices is always in reverse bias during operation.

However, in another embodiment, the two resistive switching devices may be coupled in series. In yet another embodiment, the two resistive switching devices may be coupled in parallel or anti-parallel. In a further embodiment, one of the two resistive switching devices may be an access device without a hysteresis in the current-voltage characteristic.

In the embodiment illustrated in FIG. 4, a first electrode layer 120, a switching layer 130, an intermediate electrode layer 140, and a second electrode layer 150 are stacked as in prior embodiments. Further, this embodiment includes a second switching layer 180, a second intermediate electrode layer 170, and a third electrode layer 160. The third electrode layer 160 is formed under the second intermediate electrode layer 170, which is below the second switching layer 180.

Figure 5:
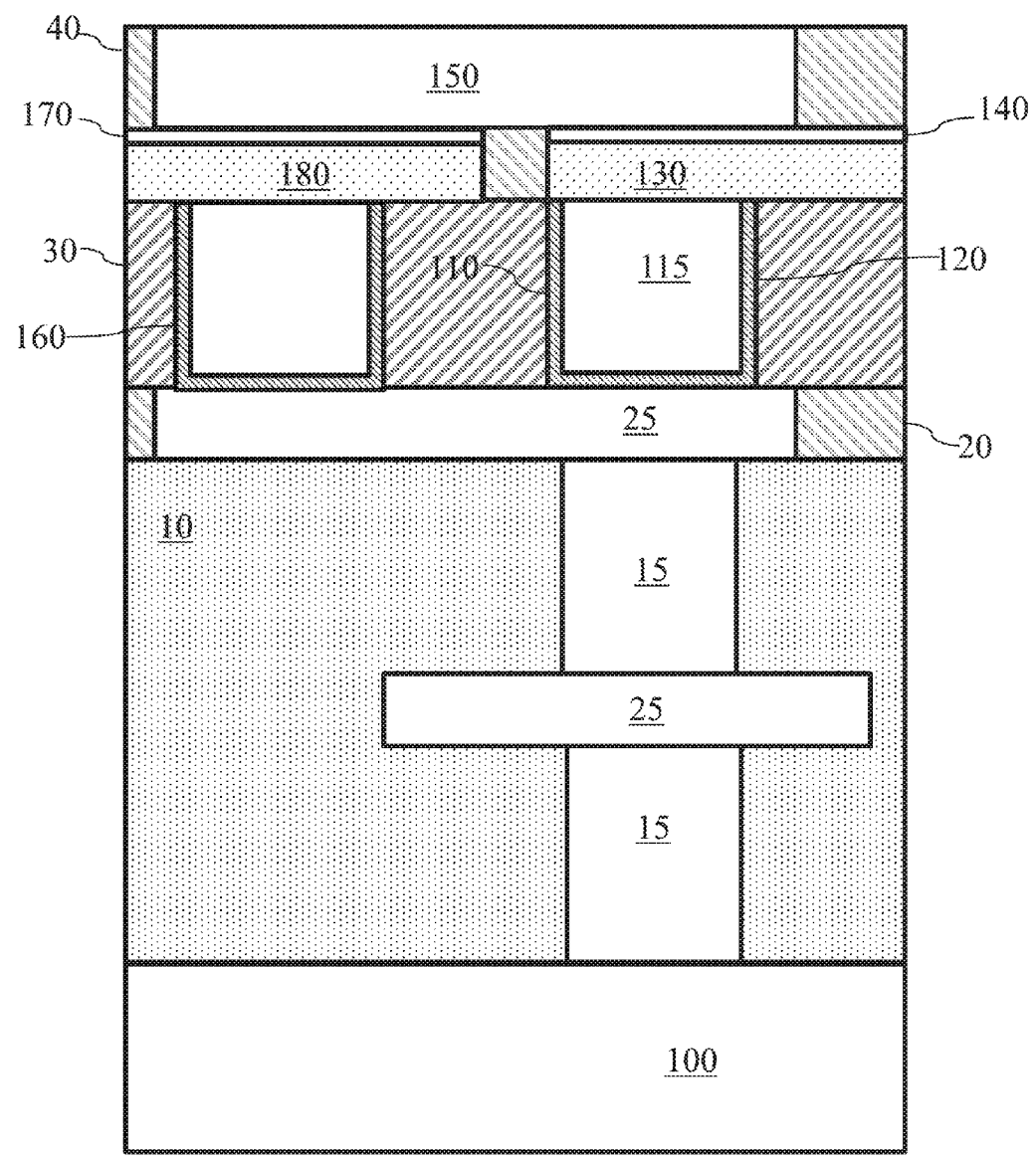
FIG. 5 illustrates two resistive switching devices coupled in parallel in accordance with an embodiment of the present invention.

FIG. 5 illustrates two resistive switching devices coupled in parallel in accordance with an embodiment of the present invention.

In one embodiment, the first electrode layer 120 and the third electrode layer 160 may be formed and coupled to a common metal line of the plurality of metal lines 25. The intermediate electrode layer 140 and the second intermediate electrode layer 170 may be formed over the first electrode layer 120 and the third electrode layer 160 respectively. A common second electrode layer 150 may be formed over the first electrode layer 120 and the third electrode layer 160.

In one or more embodiments, in FIGS. 4 and 5, the switching layer 130 and the second switching layer 180 comprise a metal oxide such as gadolinium oxide, hafnium oxide, aluminum oxide, zirconium oxide, and combinations thereof. Further, the intermediate electrode layer 140 and the second intermediate electrode layer 170 comprise a reactive element such as tellurium or selenium. In further embodiments, the intermediate electrode layer 140 and the second intermediate electrode layer 170 comprise tellurium and titanium. In various embodiments, the atomic percent of tellurium in the intermediate electrode layer 140 and the second intermediate electrode layer 170 is between 25% to 67%, and about 33% to about 65% in one embodiment.

In one or more embodiments, the intermediate electrode layer 140 and the second intermediate electrode layer 170 are in an amorphous state. In various embodiments, the thickness of the intermediate electrode layer 140 and the second intermediate electrode layer 170 is less than 100 nm in one or more embodiments. In one more embodiments, the thickness of the intermediate electrode layer 140 and the second intermediate electrode layer 170 is about 2 nm to about 30 nm.

FIG. 6, which includes FIGS. 6A-6F, illustrates cross-sectional views of a resistive switching device during various stages of fabrication in accordance with an embodiment of the present invention.

Figure 6A:
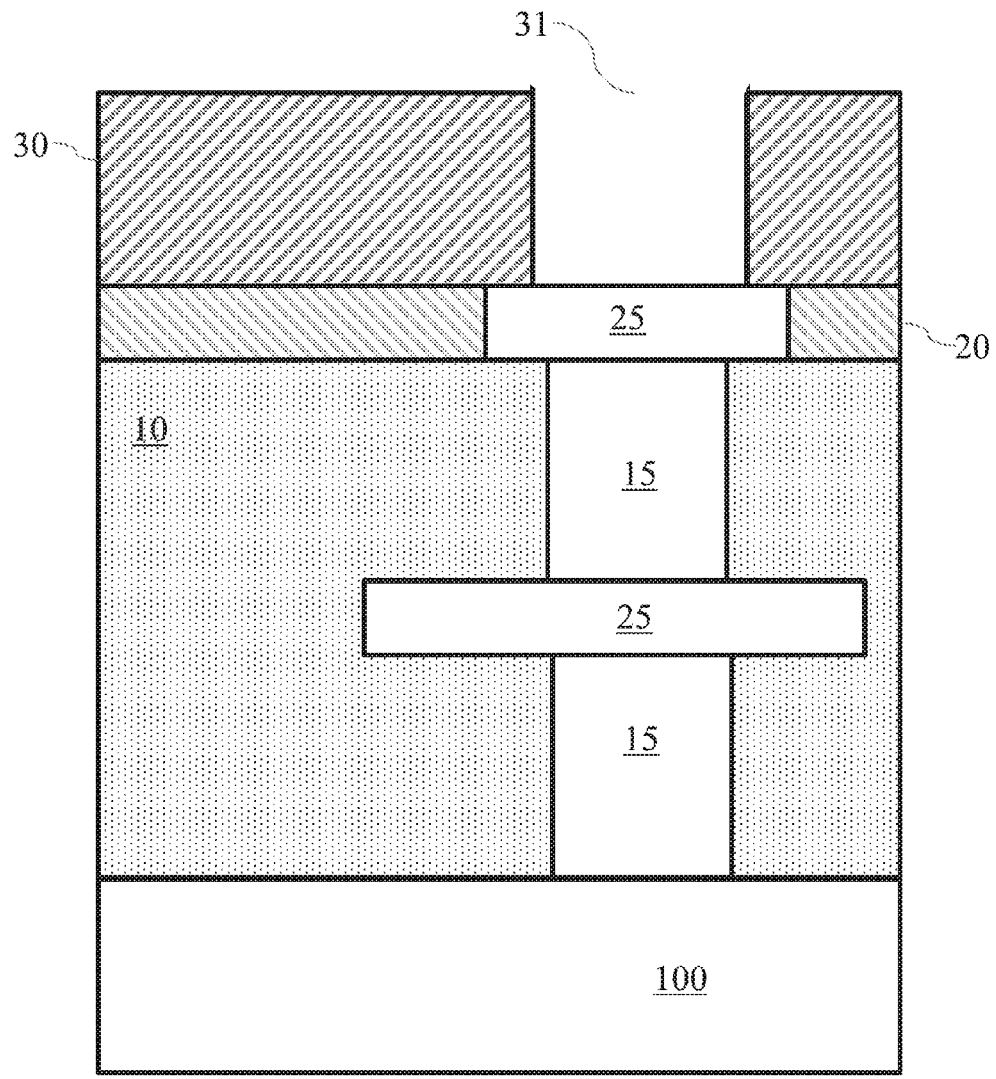
FIGS. 6A-6F, illustrates cross-sectional views of a resistive switching device during various stages of fabrication in accordance with an embodiment of the present invention.

Referring to FIG. 6A, the substrate 100 is processed using conventional processing. For example, active regions may be formed within the substrate 100. The active regions may comprise device regions such as transistors, diodes, and other devices. After forming the active regions, metallization layers are formed above the substrate 100. For example, a plurality of vias 15 and a plurality of metal lines 25 may be formed as illustrated in FIG. 6A.

In various embodiments, a bottom electrode will be formed within the third dielectric layer 30, which may comprise silicon nitride, silicon oxide, and others and may be about 10 nm to about 1000 nm, and about 30 nm to about 50 nm in one case. In one or more embodiments, the third dielectric layer 30 may be deposited using a chemical vapor deposition process or a plasma enhanced chemical vapor deposition process. The third dielectric layer 30 may be deposited using a physical vapor deposition (PVD), although in different embodiments, other deposition techniques may be used. As illustrated in FIG. 6A, an opening 31 is formed within the third insulating layer, which is formed over the substrate 100.

Figure 6B:
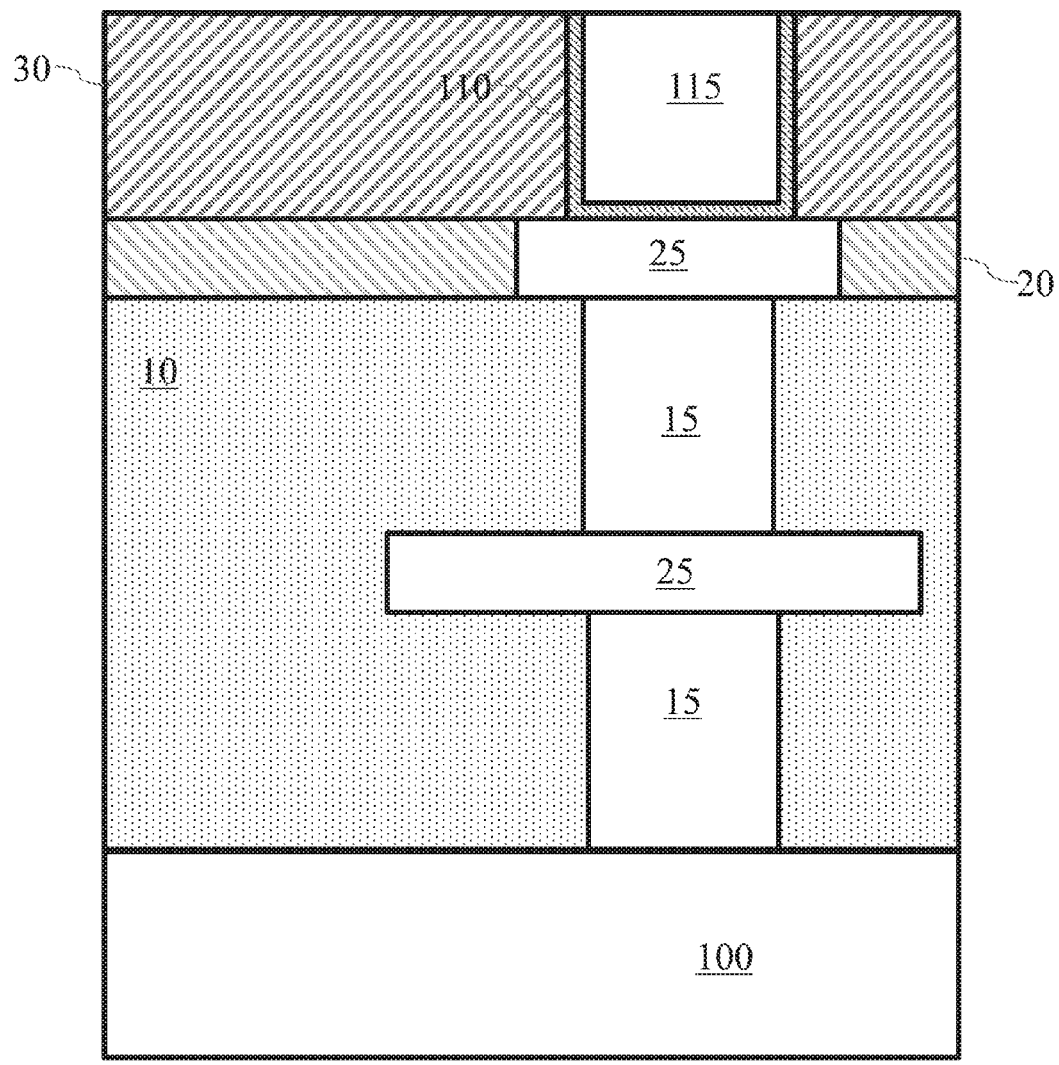

Referring to FIG. 6B, a barrier layer 110 is deposited within the opening 31. In various embodiments, the barrier layer 110 may be deposited using sputtering, a vapor deposition process such as physical vapor deposition, chemical vapor deposition, and other suitable processes. The barrier layer 110 may comprise an inert material that is also a diffusion blocking material such as titanium nitride, tantalum nitride and others.

Next, a fill material 115 is deposited within the opening 31. The fill material 115 may be deposited using multiple processes in various embodiments. For example, a thin layer of the fill material 115 may be deposited first using a physical vapor deposition (PVD) process to ensure good adhesion with the barrier layer 110. Next, a chemical vapor deposition process may be used to fill the opening 31 with the fill material 115. The fill material 115 may comprise an inert material such as tungsten or tantalum in one embodiment. The fill material 115 may be planarized as needed and any remaining barrier layer 110 over the top surface of the third insulating layer is removed, for example, using a wet etching.

Figure 6C:
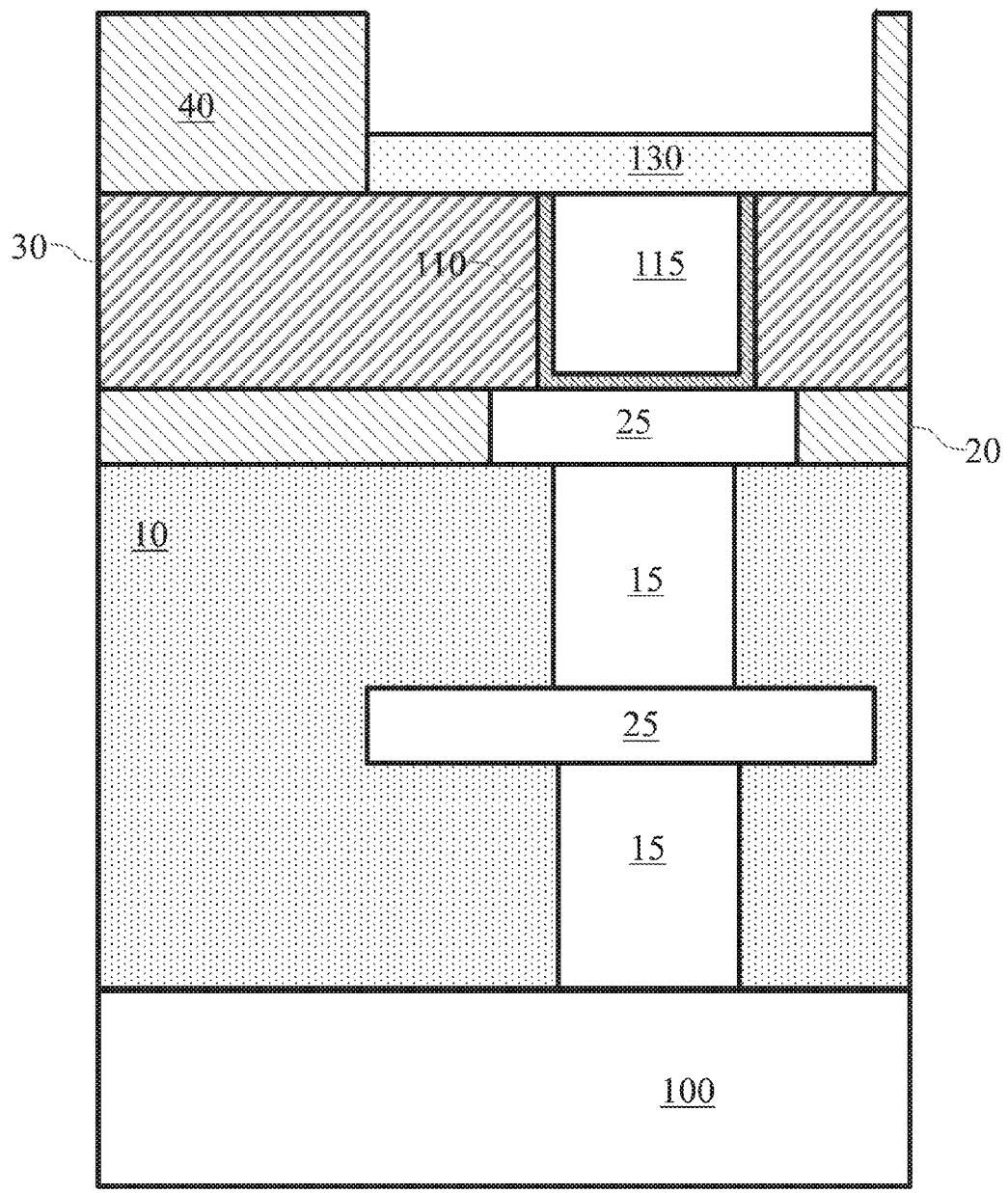

Referring to FIG. 6C, a fourth insulating layer 40 is deposited over the third insulating layer 30. The fourth insulating layer 40 is patterned to form an opening for the switching layer 130, which may be deposited within the opening. In various embodiments, the switching layer 130 comprises a metal oxide such as gadolium oxide, hafnium oxide, zirconium oxide. In alternative embodiments, the switching layer 130 comprises $NiO_x$, $TiO_x$, $Ta_2O_5$, $CuO_x$, $WO_x$, CoO, $SrZrO_3$, $(Ba, Sr)TiO_3$, $SrTiO_3$, $SiO_2$. In one embodiment, the switching layer 130 comprises a transition metal oxide such as hafnium oxide, zirconium oxide, titanium oxide, tungsten oxide, or others. In an alternative embodiment, the switching layer 130 may comprise a rare earth metal oxide such as gadolinium oxide, yttrium oxide, erbium oxide, terbium oxide, ytterbium oxide. In another embodiment, the switching layer 130 may comprise a metal oxide such as aluminum oxide. The switching layer 130 may be deposited using an atomic layer deposition process, chemical vapor deposition, physical vapor deposition, a high density plasma process, and other suitable deposition process. In some embodiments, the switching layer 130 may be formed in multiple steps, for example, a deposition process forming a layer of elemental metal followed by an oxidation step to oxidize the elemental metal to a metal oxide. In various embodiments, the switching layer 130 may have thickness of about 1 nm to about 20 nm.

Figure 6D:
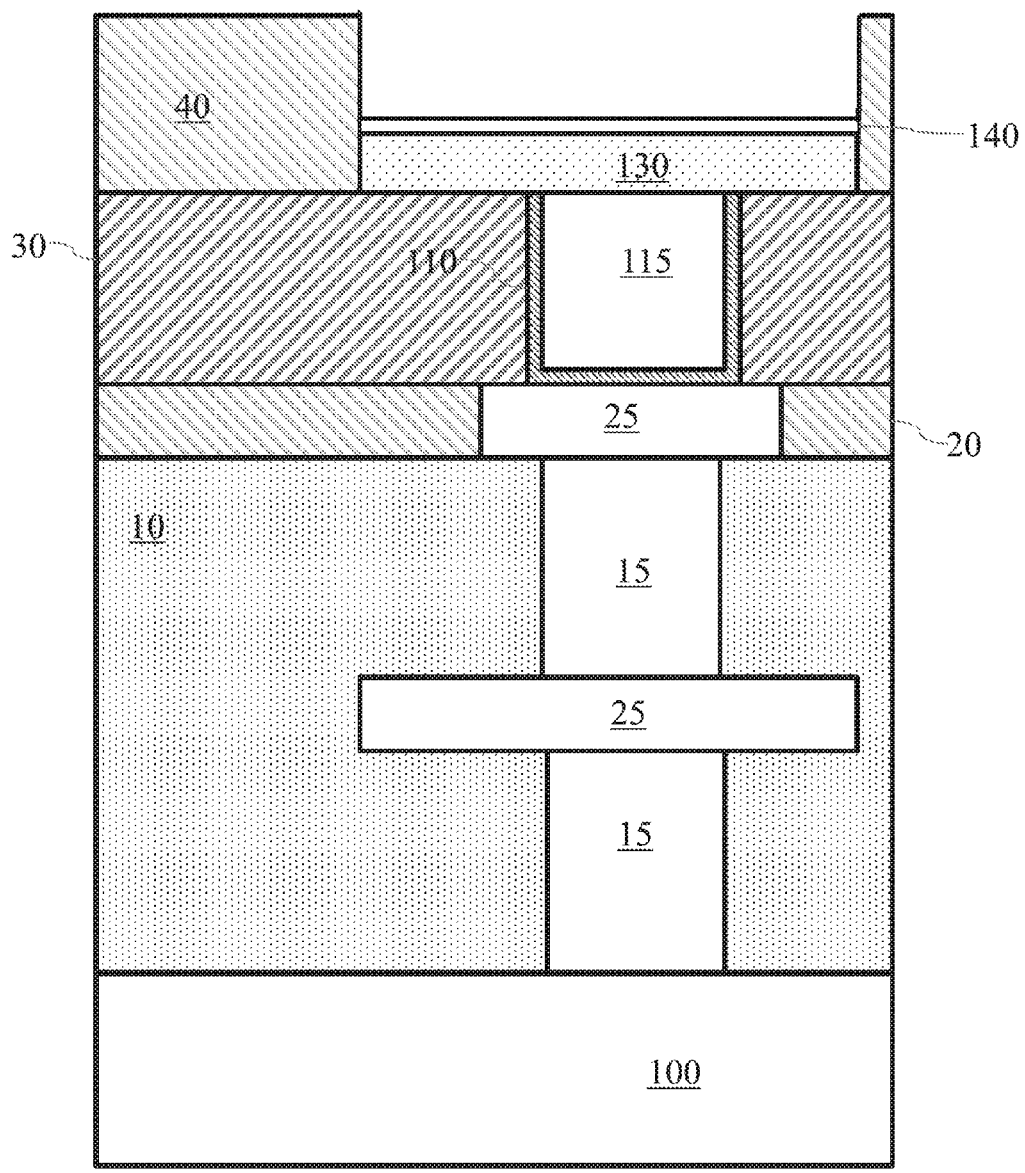

Referring to FIG. 6D, an intermediate electrode layer 140 is formed over the switching layer 130. In various embodiments, the intermediate electrode layer 140 may include a reactive element such a tellurium and/or selenium. In one embodiment, tellurium may be selected over selenium.

In one or more embodiments, the intermediate electrode layer 140 comprises a reactive element (tellurium) and a metal from Group IV (Ti, Hf, Zr) of the modern periodic table. In one embodiment, the reactive element and the Group 4 metal are co-sputtered using separate target materials, for example, a first target comprising the reactive element and a second target comprising the Group 4 metal. In one embodiment, the co-sputtering may produce an amorphous layer comprising the reactive element and the Group 4 metal during deposition avoiding a separate annealing process to form the amorphous layer. In a further embodiment, a common target material comprising the reactive element and the Group 4 metal may be used as the source for the sputtering process. Thus, in this embodiment, the sputtering process deposits the intermediate electrode layer 140 comprising the reactive element (tellurium) and the metal from Group IV (Ti, Hf, Zr) from a common target. In another embodiment, the reactive element and the Group 4 metal are deposited using a vapor deposition process such as chemical vapor deposition, high density plasma chemical vapor deposition, electrochemical deposition, and other types of physical vapor deposition such as molecular beam epitaxy.

In further embodiments, elements such as hafnium, zirconium, and/or other transition or rare earth metals may also be added to the intermediate electrode layer 140 to increase the stability of the amorphous phase. In various embodiments, these elemental additions may be achieved by co-sputtering of separate elemental targets, using a target comprising multiple elements, or by further sequential alternate-layer sputtering followed by annealing to induce solid phase amorphization.

In one embodiment, the intermediate electrode layer 140 is deposited using an atomic layer deposition process. A thin layer of the reactive element (RE) may be deposited followed by a thin layer of the Group 4 metal (G4). The thin layer of the reactive element and the thin layer of the Group 4 metal may be a pure elemental layer, or alloys, compounds thereof in various embodiments. For example, a 0.1 nm layer of the reactive element (RE) may be deposited followed by a 0.1 nm layer of the Group 4 metal. The process may be repeated many (n) times to form a super lattice stack comprising $(RE-G4)^n$. The thin layer of the reactive element (RE) may intermix with the thin layer of the Group 4 metal (G4) during subsequent processing, for example, during a subsequent annealing process.

In one or more embodiments, the intermediate electrode layer 140 is deposited in an amorphous state without long range order. The use of the amorphous state of the intermediate electrode layer 140 makes the electrical characteristics more uniform from device to device. The reactivity of the amorphous state may enable interaction with the switching layer 130, which is leveraged during the operation of the device. In various embodiments, the intermediate electrode layer 140 may have thickness of less than about 100 nm, and about 2 nm to about 30 nm in one embodiment. In various embodiments, the intermediate electrode layer 140 is about 2 nm to about 100 nm.

In various embodiments, the intermediate electrode layer 140 and the switching layer 130 may not include an electrochemically active metal such as copper, silver, gold, zinc.

Figure 6E:
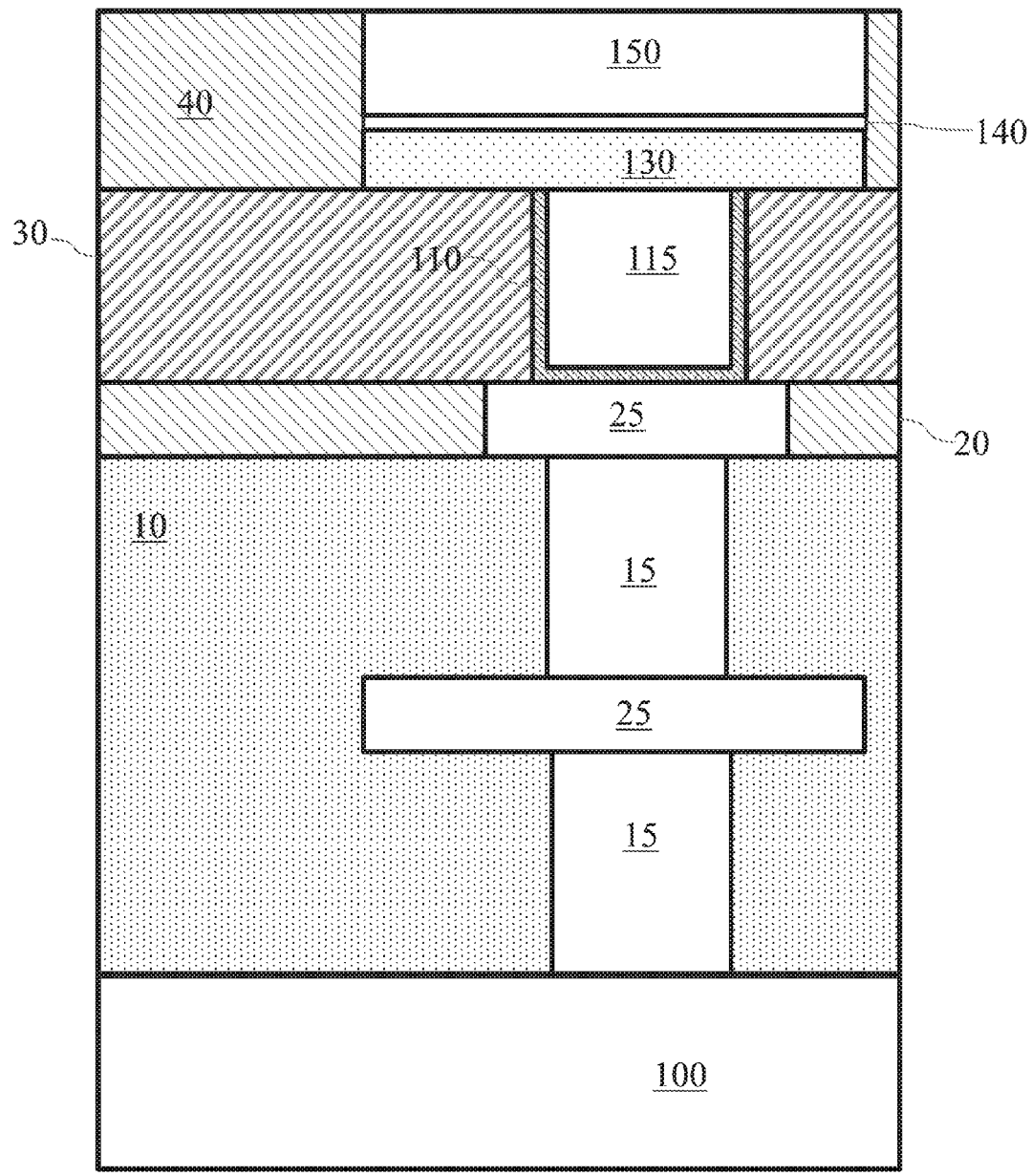

Referring next to FIG. 6E, a second electrode layer 150 is formed over the intermediate electrode layer 140. In various embodiments, the second electrode layer 150 comprises an inert material. In one or more embodiments, the second electrode layer 150 may not include an electrochemically active metal such as copper, silver, gold, zinc. In one embodiment, the second electrode layer 150 comprises a metal nitride. In one embodiment, the second electrode layer 150 comprises titanium nitride. In various embodiments, the second electrode layer 150 is inert with the reactive element (tellurium or selenium) of the intermediate electrode layer 140. Subsequent processing may follow conventional processing. However, in various embodiments, subsequent processing is carried at low temperatures, for example, below 400° C. to prevent crystallization of the intermediate electrode layer 140.

Figure 6F:
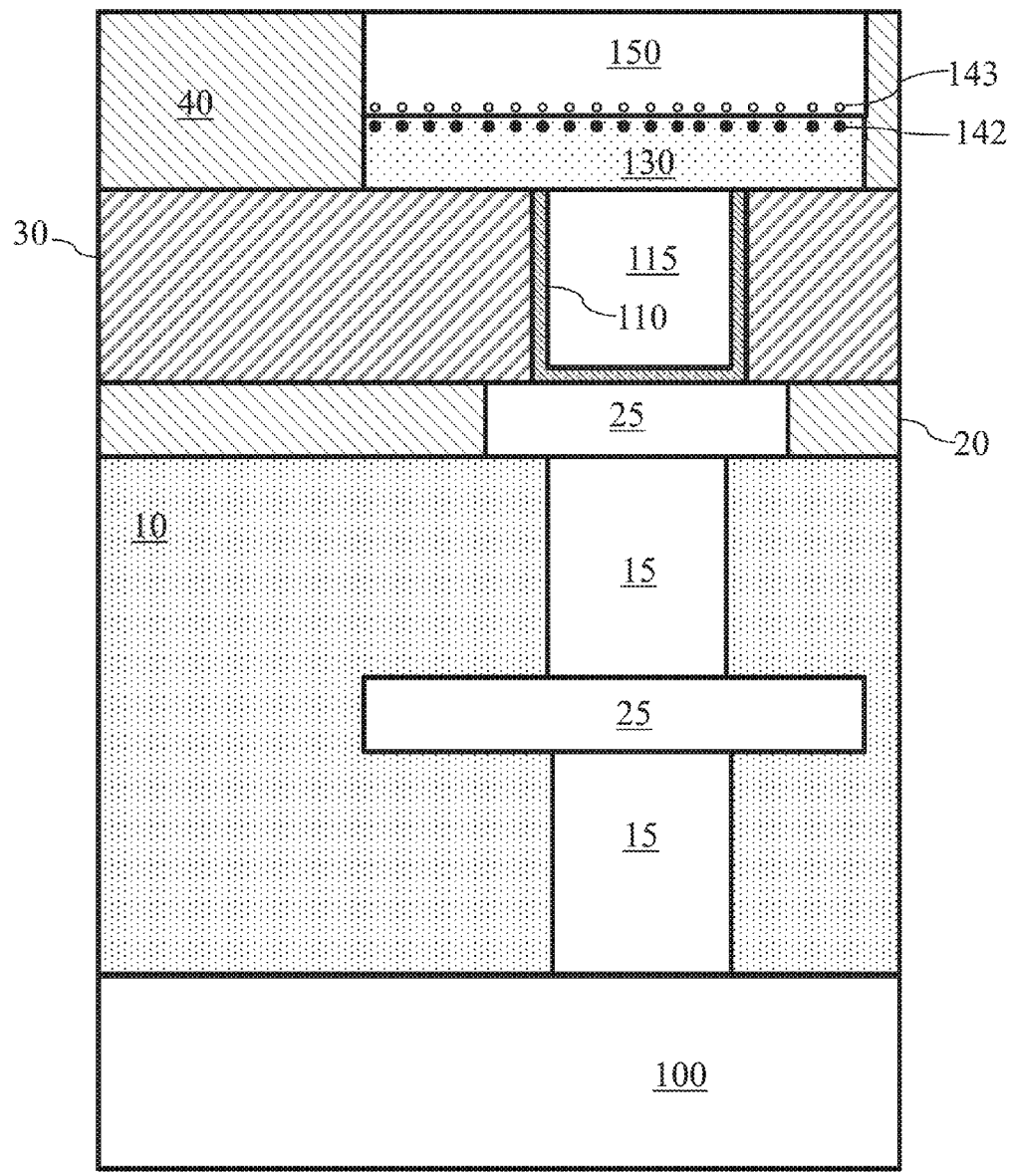

FIG. 6F illustrates an alternative embodiment in which the intermediate electrode layer 140 interacts with the switching layer 130 during processing. For example, in one embodiment, the tellurium atoms in the intermediate electrode layer 140 may interact with the switching layer 130 modifying the previously deposited switching layer 130. As indicated, the tellurium atoms 142 and optionally the group 4 element may be incorporated at the interface between the intermediate electrode layer 140 and the switching layer 130. Further, the tellurium atoms 142 and optionally the group 4 element may be incorporated into the switching layer 130. In another embodiment, the intermediate electrode layer 140 may not completely dissociate, for example, as a combination of FIGS. 6E and 6F. The intermediate electrode layer 140 may pull oxygen atoms from the switching layer 130, and the amount of oxygen atoms pulled from the switching layer may depend on the stoichiometry and/or microstructure of the intermediate electrode layer 140.

FIG. 7, which includes FIGS. 7A-7D, illustrate cross-sectional views of the resistive switching device during the formation the intermediate electrode layer in accordance with alternative embodiments of the present invention.

In one embodiment, the intermediate electrode layer may be formed as a plurality of layers. As an illustration, in one embodiment illustrated in FIG. 7A, a first intermediate layer 138 may be deposited followed by a second intermediate layer 139. The first intermediate layer 138 may comprise the reactive element (tellurium or selenium) while the second intermediate layer 139 may comprise the group 4 metal (titanium, zirconium, hafnium). The first intermediate layer 138 and the second intermediate layer 139 may intermix during processing. Alternatively, only a portion of the first and the second intermediate layer 138 and 139 may intermix. In a further embodiment, the first intermediate layer 138 and the second intermediate layer 139 may intermix and form an amorphous layer during a subsequent annealing step, for example, after an annealing process less than 400° C. In one embodiment, titanium and tellurium layer may be sequentially deposited. The sequential deposition of titanium and tellurium layers, followed by a thermal anneal may induce solid state amorphization resulting in an amorphous $Ti_xTe_{1-x}$ layer. Subsequent processing may follow as described in FIG. 6.

Figure 7A:
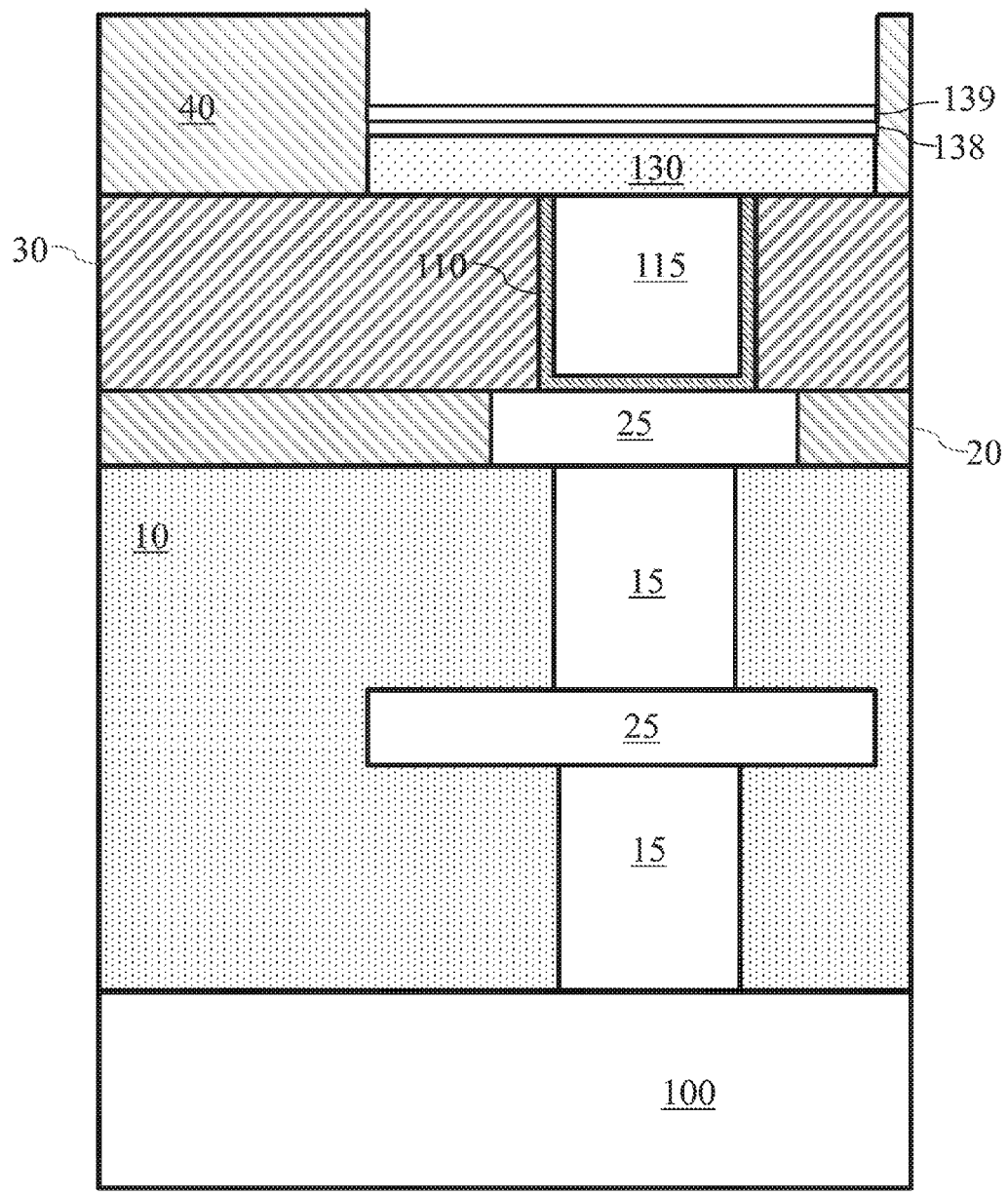
FIGS. 7A-7D, illustrate cross-sectional views of the resistive switching device during the formation the intermediate electrode layer in accordance with alternative embodiments of the present invention.
Figure 7B:
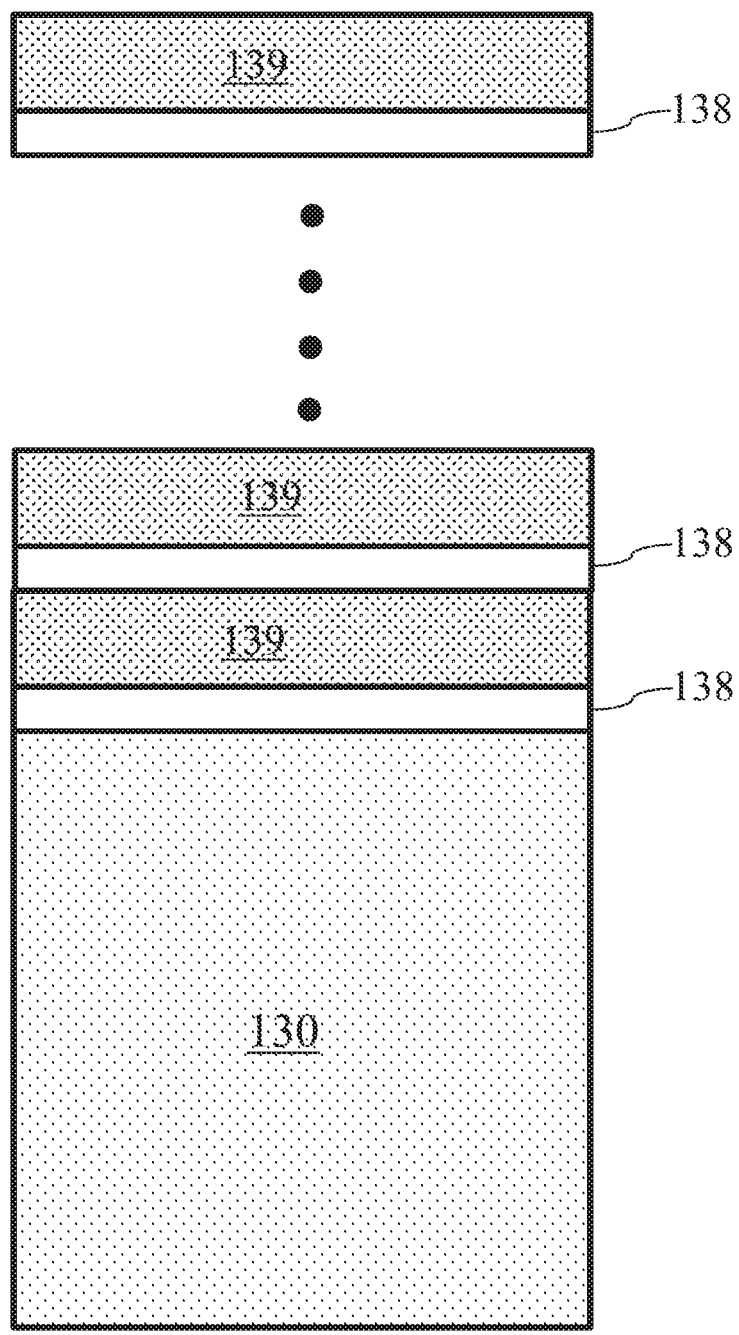

In an alternative embodiment, the first intermediate layer 138 and the second intermediate layer 139 may be deposited sequentially forming a layer stack as illustrated in FIG. 7B. The thicknesses of the first intermediate layer 138 and the second intermediate layer 139 may be varied by deposition power density and time. In one or more embodiments, the first intermediate layer 138 and the second intermediate layer 139 may be deposited alternatively for many cycles until a desired total thickness is reached.

In one or more embodiments, the final layered structure is then annealed to form an intermixed film thereby forming the intermediate electrode layer 140. The composition of the intermediate electrode layer 140 may thus be varied by varying the thickness of each individual layer, i.e., the thickness of the first intermediate layer 138 and the second intermediate layer 139. In one embodiment, the first intermediate layer 138 comprises a layer of pure tellurium and the second intermediate layer 139 comprises a layer of pure titanium. The thickness of the titanium and tellurium may be varied to obtain a titanium composition of about 30% to about 70% in one embodiment.

As an example, in one embodiment, the first intermediate layer 138 and the second intermediate layer 139 may be deposited in a plasma vapor deposition (PVD) process. The first intermediate layer 138, for example, comprising tellurium, may be deposited using power in the range of 0.09 W/cm$^2$ to 0.26 W/cm$^2$. The thickness of the first intermediate layer 138 may be in the range of 0.5 nm to 5 nm in one embodiment. As another example, the second intermediate layer 139, which may comprise titanium, may be deposited using a PVD power in the range of 0.37 W/cm$^2$ to 0.9 W/cm$^2$. The thickness of the second intermediate layer 139 may be in the range of 1 nm to 5 nm in one embodiment. The final thickness of the intermediate electrode layer 140 thus formed may be in the range of 1.5 nm to 50 nm in one or more embodiments, and about 2 nm to about 30 nm in one embodiment, and less than 100 nm in various embodiments.

The annealing temperature may be in the range of 100° C. to 600° C. in various embodiments, and about 200° C. to about 300° C. in one embodiment. The annealing time may be in the range of 1 minute to 60 minutes in various embodiments, and about 1 minute to 20 minutes in one embodiment. The annealing ambient may be vacuum, nitrogen, and/or argon in various embodiments.

Figure 7C:
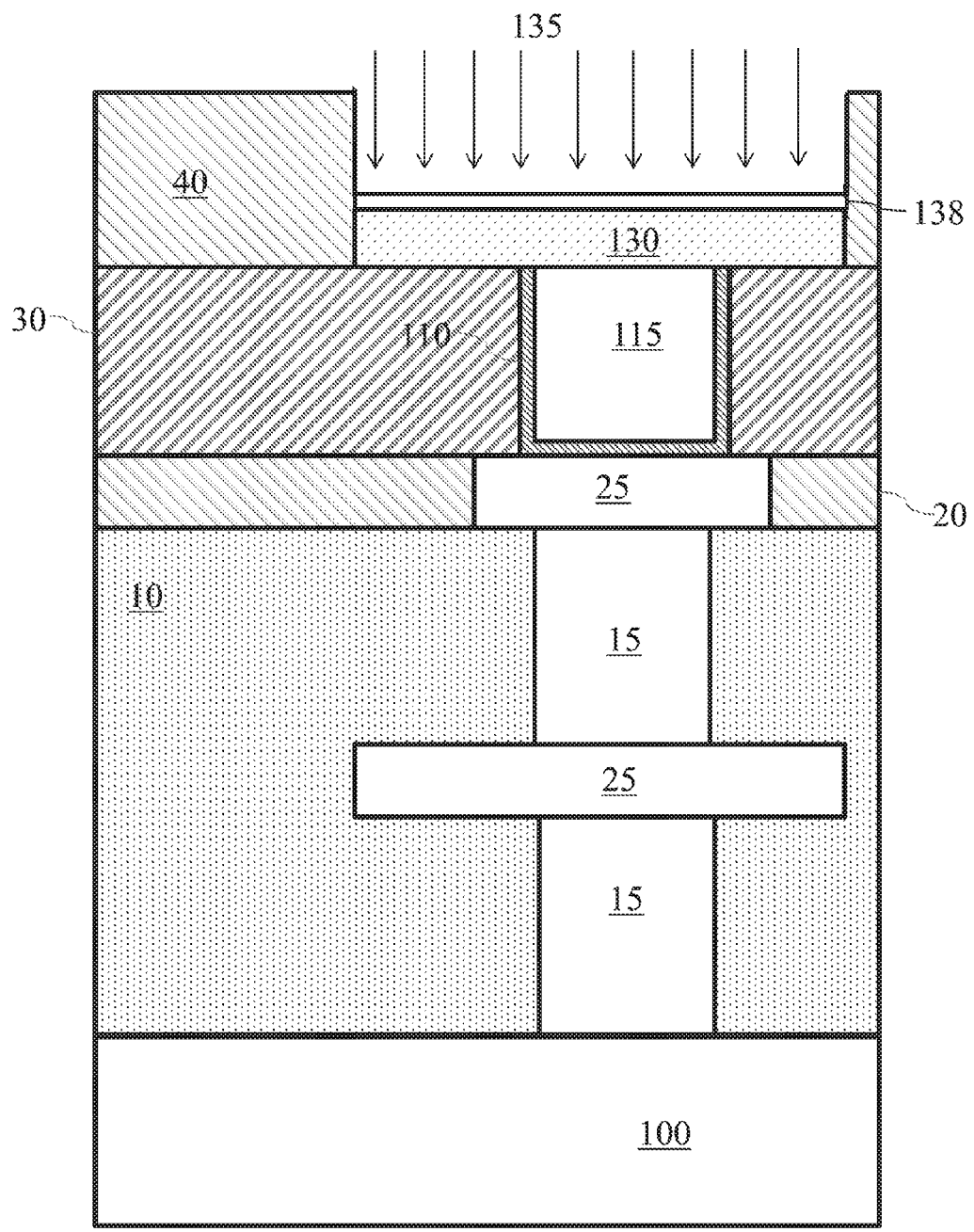

In an alternative embodiment as illustrated in FIG. 7C, a first intermediate layer 138 comprising the reactive element and the group 4 metal may be deposited. The first intermediate layer 138 may be subjected to an amorphizing process 135. For example, in one embodiment, the first intermediate layer 138 may be subjected to high dose inert implant such as argon to amorphize the first intermediate layer 138. This may help to break up any polycrystalline material formed during deposition.

In a further embodiment, the first intermediate layer 138 may be deposited having a single element, for example, a layer of group 4 metal may be deposited. The reactive element may be implanted into the group 4 metal layer. Alternatively, the first intermediate layer 138 may be deposited as a layer of reactive element and the group 4 metal may be implanted into the first intermediate layer 138. Advantageously, the implantation process may amorphize the previously deposited first intermediate layer 138, which may be polycrystalline.

Figure 7D:
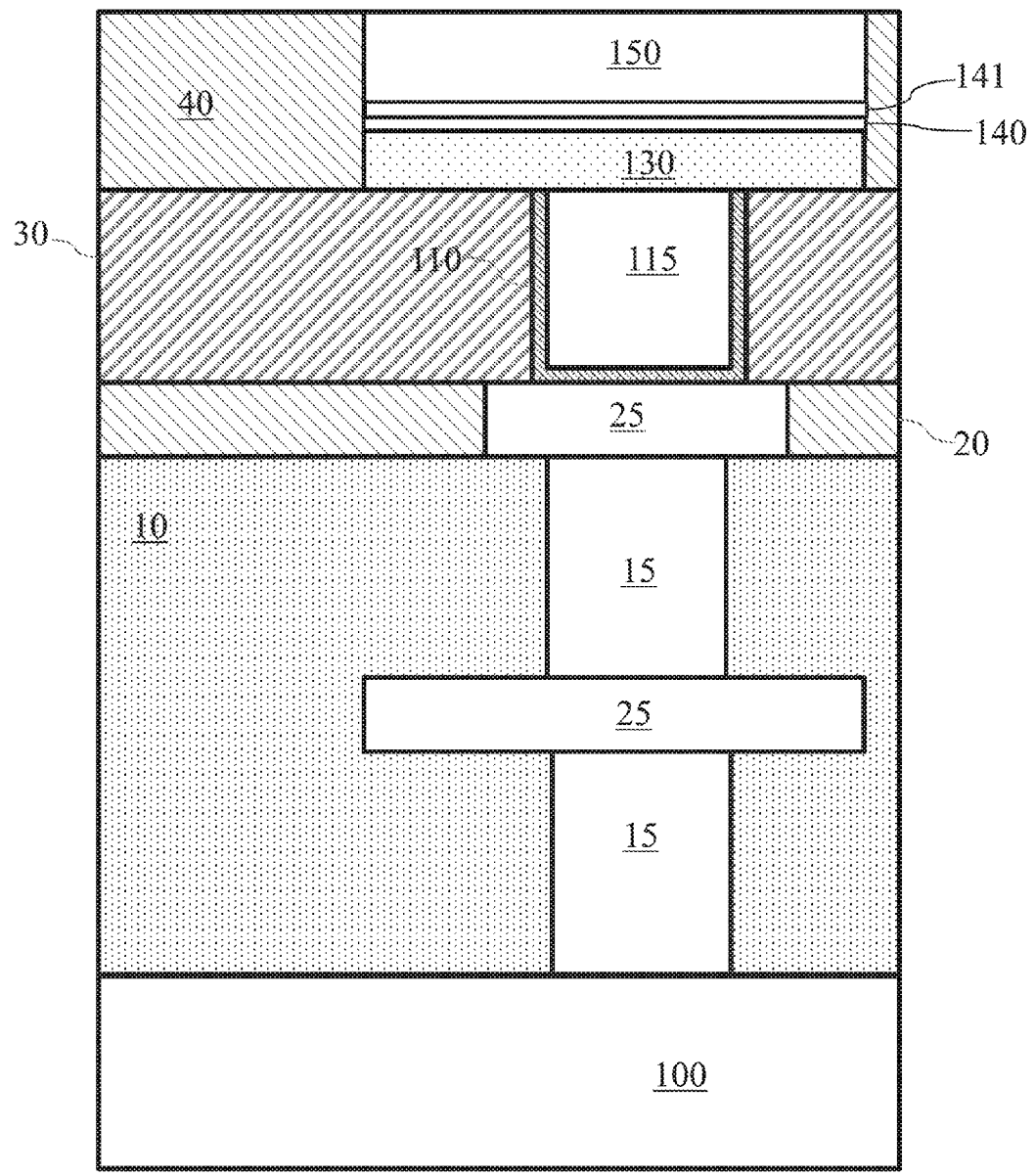

FIG. 7D illustrates a further embodiment in which a diffusion barrier layer is deposited over the intermediate electrode layer in accordance with an embodiment of the present invention. In this embodiment, an additional diffusion barrier layer 141 is deposited on the intermediate electrode layer 140 and between the intermediate electrode layer 140 and the second electrode layer 150. The diffusion barrier layer 141 may help to prevent diffusion of reactive elements such as tellurium from the intermediate electrode layer 140 as well as also prevent diffusion of metals such as copper, silver, gold, zinc and others from other metal lines and other sources. In some embodiments, the second electrode layer 150 may not be able to prevent the migration of such contaminating atoms. In such embodiments, an additional diffusion barrier layer 141 is deposited. The diffusion barrier layer 141 may comprise a metal nitride in various embodiments, for example, a titanium nitride layer may be used as the diffusion barrier layer 141.

Figure 8A:
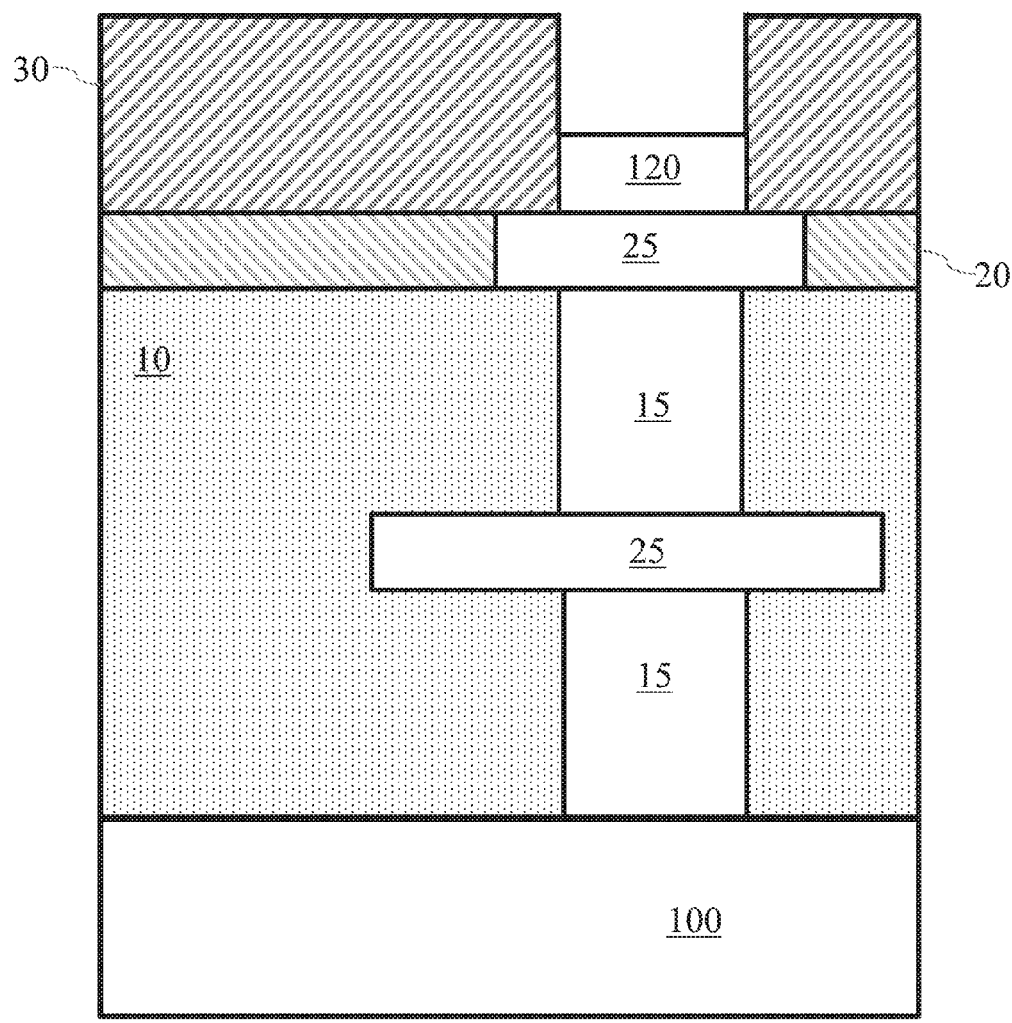
FIGS. 8A-8C, illustrates cross-sectional views of a resistive switching device during various stages of fabrication in accordance with an embodiment of the present invention.
Figure 8B:
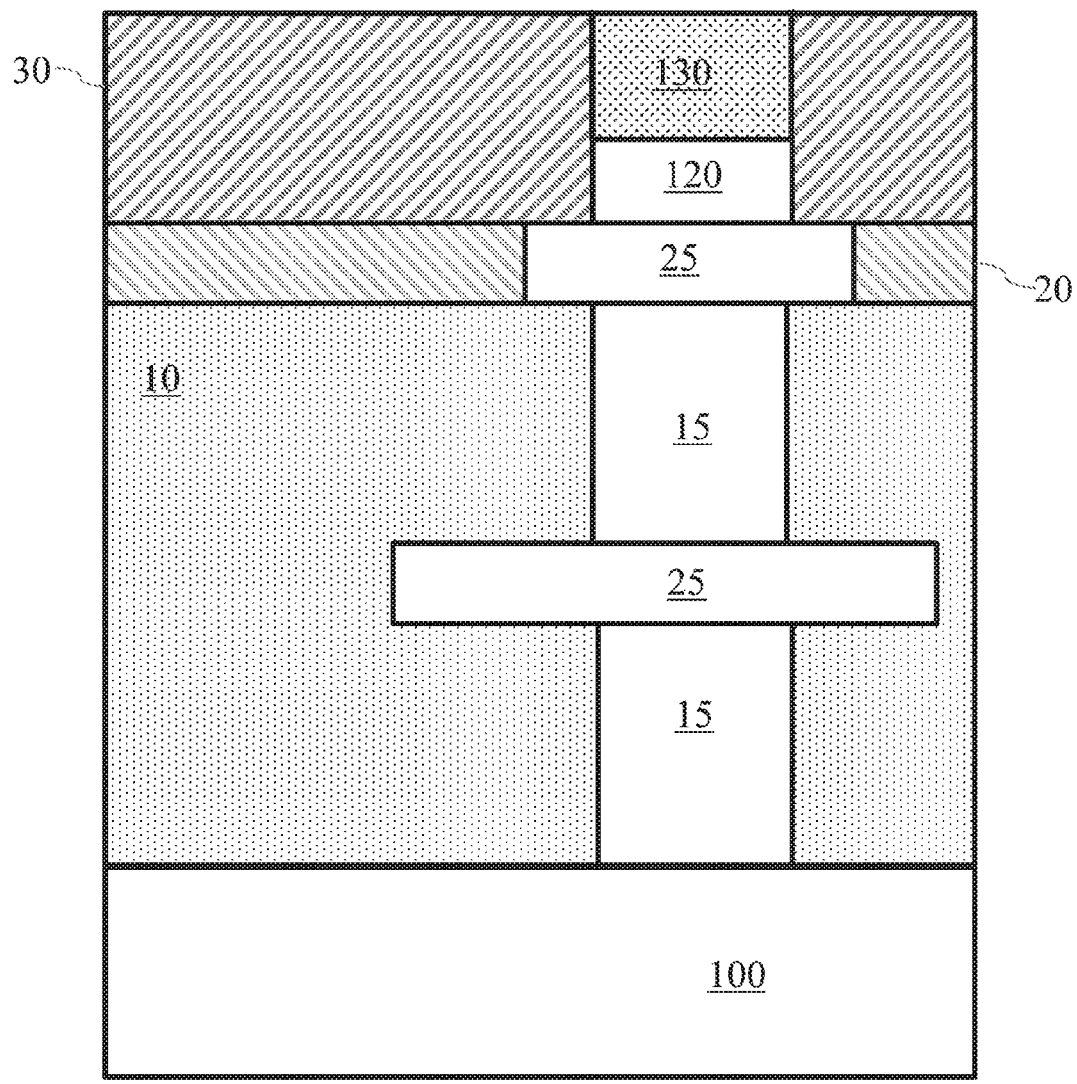
Figure 8C:
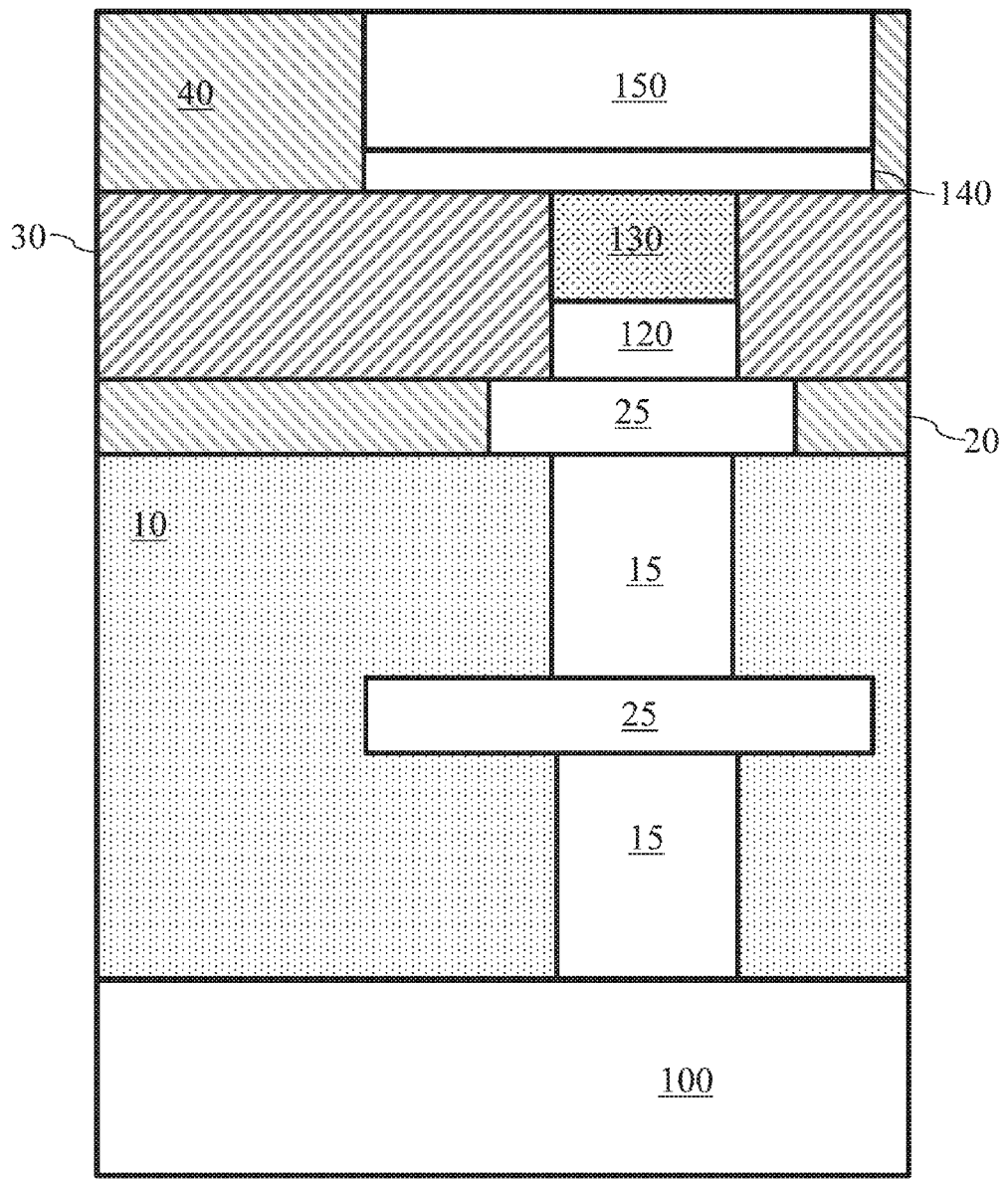

FIG. 8, which includes FIGS. 8A-8C, illustrates cross-sectional views of a resistive switching device during various stages of fabrication in accordance with an embodiment of the present invention.

Various embodiments of the present invention include variations in the structures illustrated in FIGS. 1-7. For example, in this embodiment, the switching layer and the bottom electrode are formed within the same via hole. As illustrated in FIG. 8A, the first electrode layer 120 may be formed to partially fill the opening. Next, as illustrated in FIG. 8B, the switching layer 130, which may be a metal oxide layer is deposited. Subsequent processing may continue as illustrated in FIG. 8C with the formation of the intermediate electrode layer 140 and the second electrode layer 150.

Figure 9A:
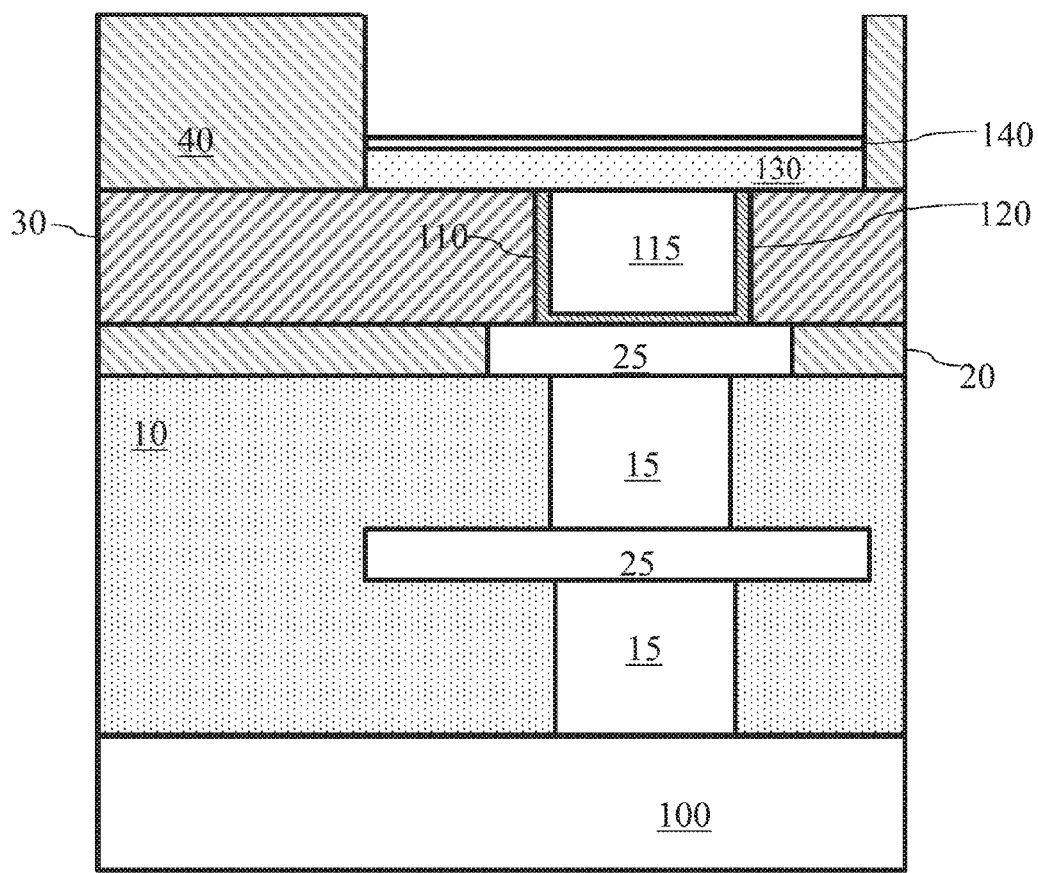
FIGS. 9A-9C, illustrates cross-sectional views of a resistive switching device stack during various stages of fabrication in accordance with an embodiment of the present invention.
Figure 9B:
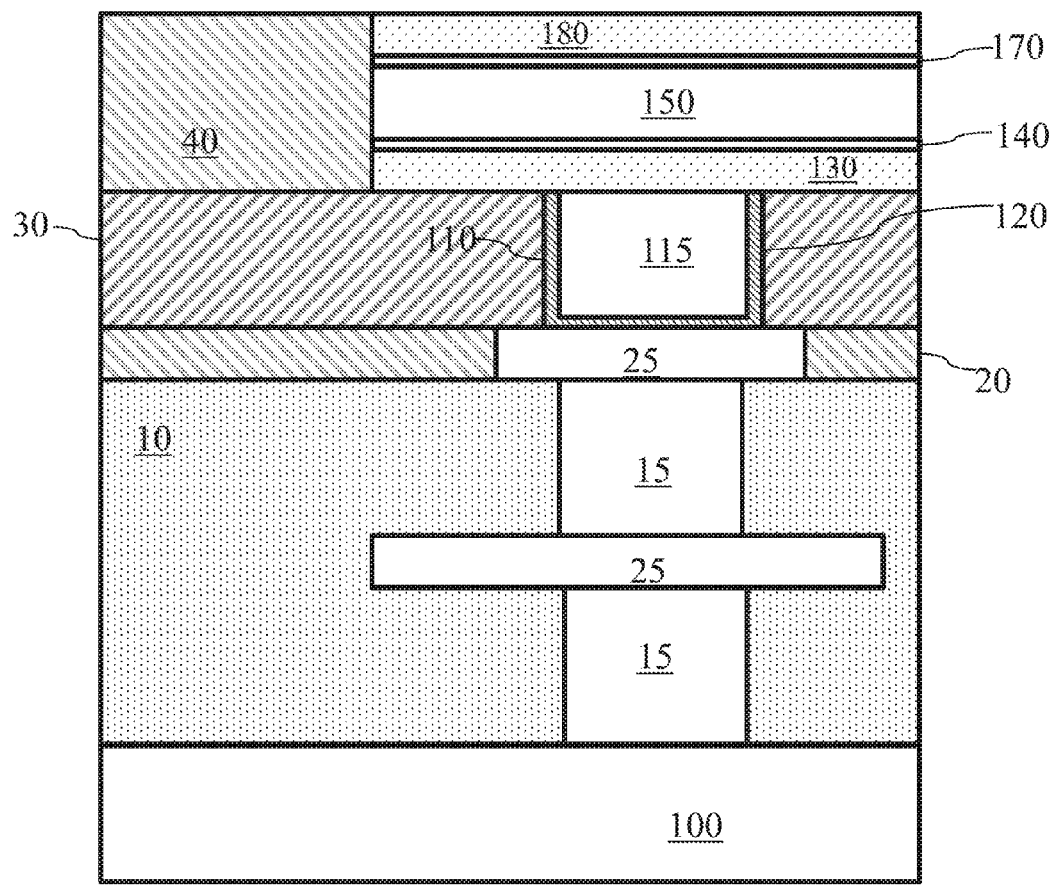
Figure 9C:
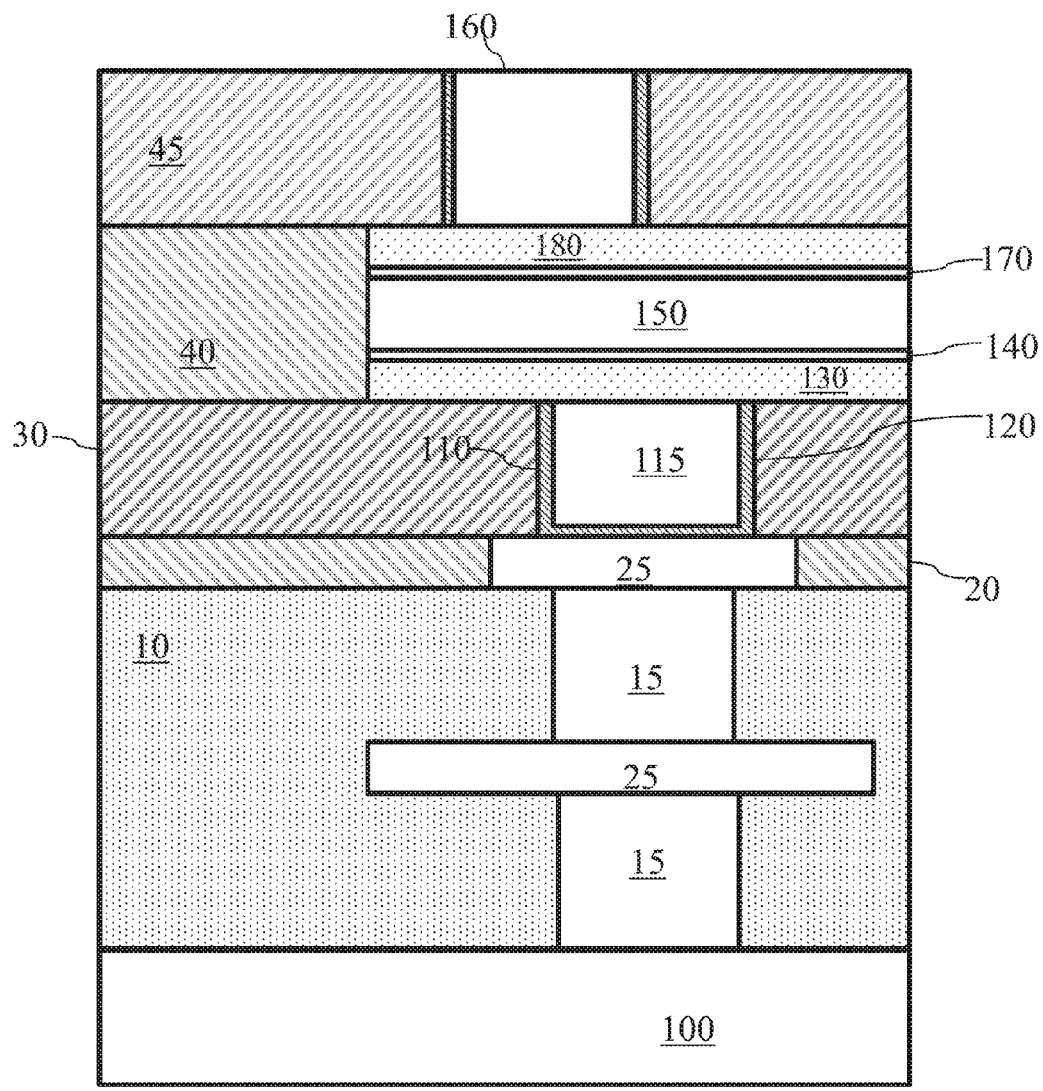

FIG. 9, which includes FIGS. 9A-9C, illustrates cross-sectional views of a resistive switching device during various stages of fabrication in accordance with an embodiment of the present invention.

FIG. 9 illustrates a method of forming a stack of resistive switching device in accordance with an embodiment of the present invention. In various embodiments, stacks of resistive switching devices may be formed to leverage common electrodes. For example, as illustrated in FIG. 9A, the switching layer 130 and the intermediate electrode layer 140 may be formed over the first electrode layer 120 as in prior embodiments.

Referring to FIG. 9B, the second electrode layer 150 is formed over the intermediate electrode layer 140. A second intermediate layer 170 and a second switching layer 180 may be formed over the second electrode layer 150 within the fourth insulating layer 40. In some embodiments, the fourth insulating layer 40 may comprise multiple insulating layers. A third electrode layer 160 may be formed over the second switching layer 180 within a fifth insulating layer 45.

In one embodiment, the second electrode layer 150 may be a titanium nitride (TiN) layer. In another embodiment, the second electrode layer 150 may comprise a tri-layer stack comprising TiN/W/TiN. The third electrode layer 160 may comprise tungsten in one embodiment.

Figure 10A:
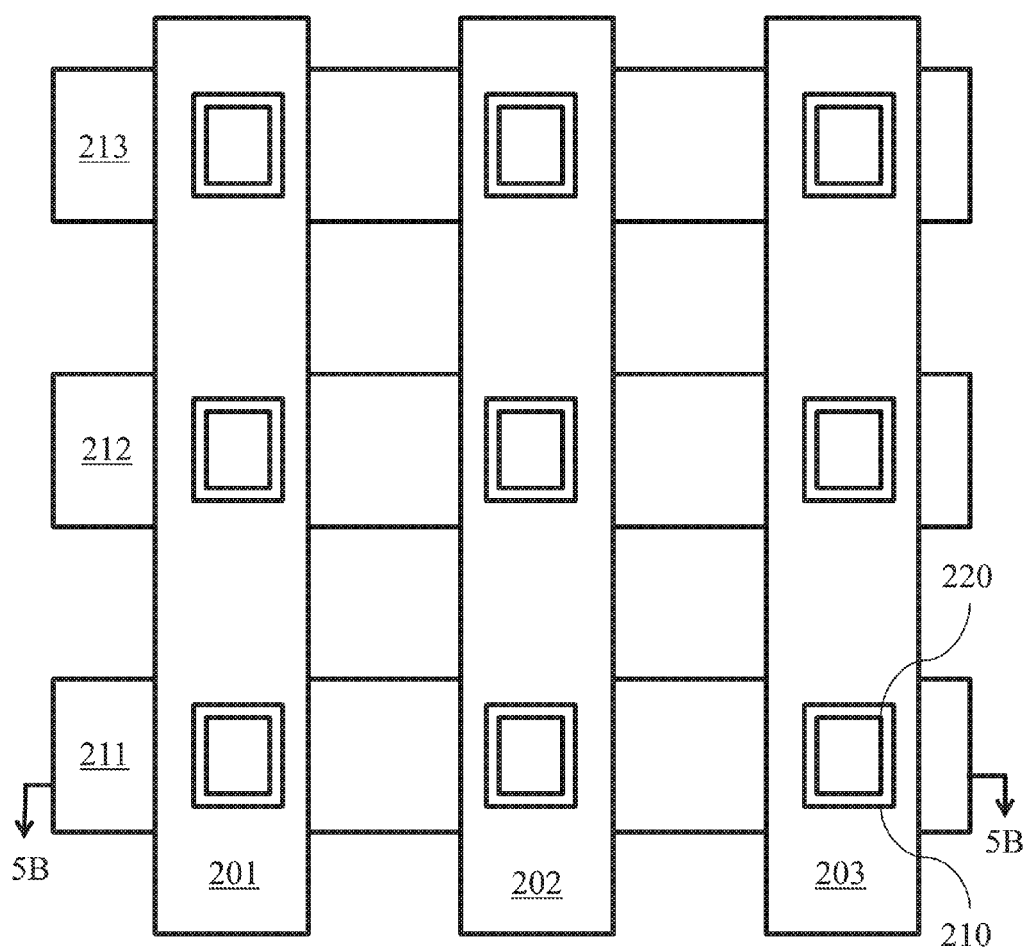
Figure 10B:
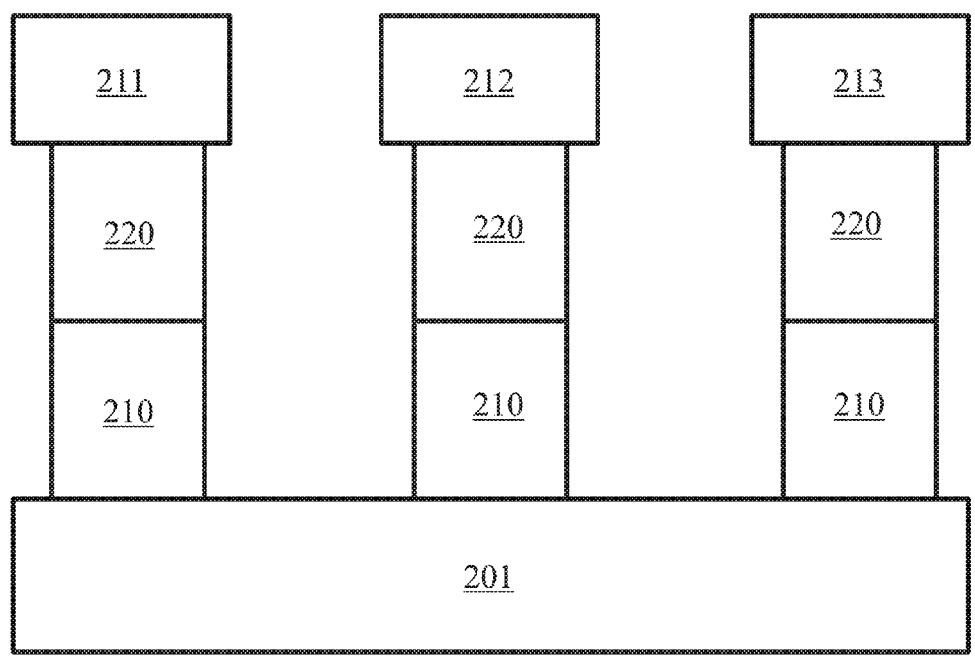

FIG. 10, which includes FIGS. 10A and 10B, illustrates a cross-point device array in accordance with embodiments of the present invention. FIG. 10A illustrates a top view and FIG. 10B illustrates a cross-sectional view.

FIG. 10 illustrates a cross-point device array, for example, as a stacked array. Each cell in the array may include a two terminal access device 210 and a memory device 220 (see also FIG. 10B). The memory device 220 may comprise a flash memory, a phase change memory, a resistive memory, a magnetic memory, a ferroelectric memory, or others, in various embodiments.

In one or more embodiments, the cross-point device array may be a memory array. In alternative embodiments, such arrays may also be used to form logic devices. Each memory device 220 in the cross-point device array is coupled between a first plurality of lines (e.g., a first, a second, and a third vertical line 201, 202, and 203) and a second plurality of lines (e.g., a first, a second, and a third horizontal line 211, 212, and 213). The first and the second plurality of lines may be perpendicular to each other in one embodiment. The first plurality of lines may be a metal level immediately above or below the second plurality of lines.

Each memory device 220 may be coupled between a line of the first plurality of lines in a first metal level and a line of the second plurality of lines in a metal level vertically above or below the first metal level. For example, one of the access device 210 and one of the memory device 220 is coupled between the first vertical line 201 and the first horizontal line 211.

In various embodiments, the memory device 220 comprises a resistive switching device having a oxide switching layer and an intermediate electrode layer as described in various embodiments of the present invention. In one embodiment, the access device 210 comprises a resistive switching device having a oxide switching layer and an intermediate electrode layer as described in various embodiments of the present invention. In various embodiments, the memory device 220 and/or the access device 210 is implemented using the resistive switching device described in various embodiments.

Figure 11A:
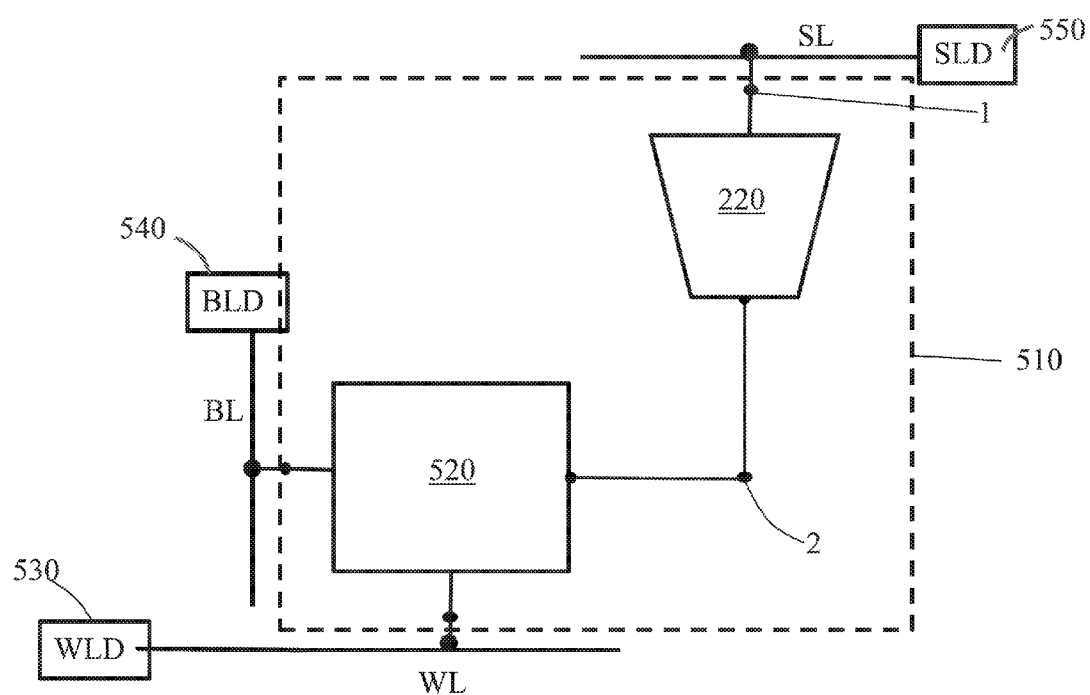
Figure 11B:
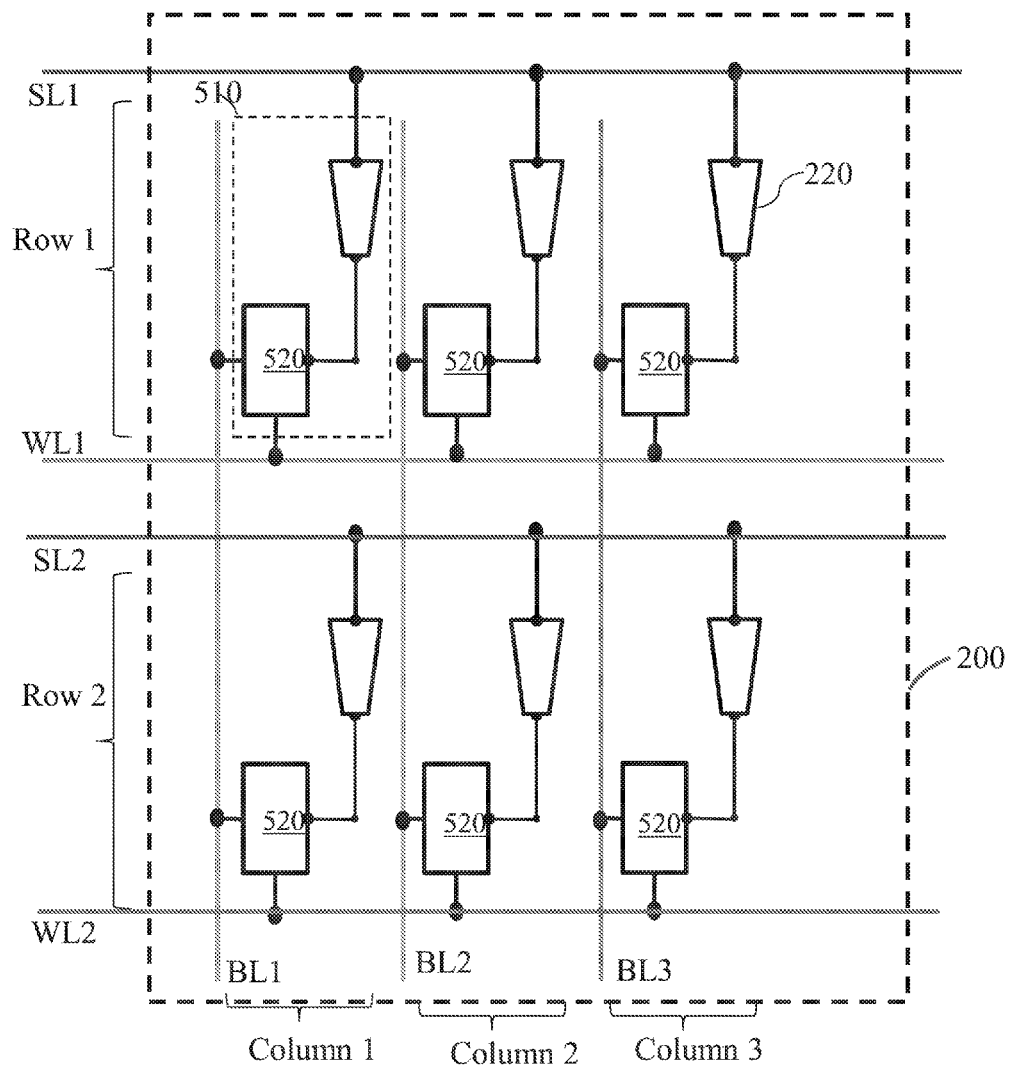

FIG. 11, which includes FIGS. 11A and 11B, illustrates various memory cell array implementing embodiments of the invention.

A memory cell array 500 may be formed using the memory device implementing the various embodiments described above. The memory device 220 may be formed as described in various embodiments. In one embodiment illustrated in FIG. 11A, a memory cell array 500 may be formed from the memory cell 510 comprising a transistor based access device 520 and a memory device 220.

The access device 520 may be coupled between the memory device 220 and a bit line (BL) driven by a bit line driver 540. The access device may be activated by a word line driver 530 through a word line. The memory device 220 may be coupled to a select line, which is further coupled to a select line driver 550.

FIG. 11B illustrates a corresponding memory array in which the memory cells 510 are arranged in rows and column and coupled to a plurality to word lines (e.g., WL1, WL2), a plurality of bit lines (e.g., BL1, BL2, BL3), and a plurality of select lines (E.g., SL1, SL2).

Figure 12:
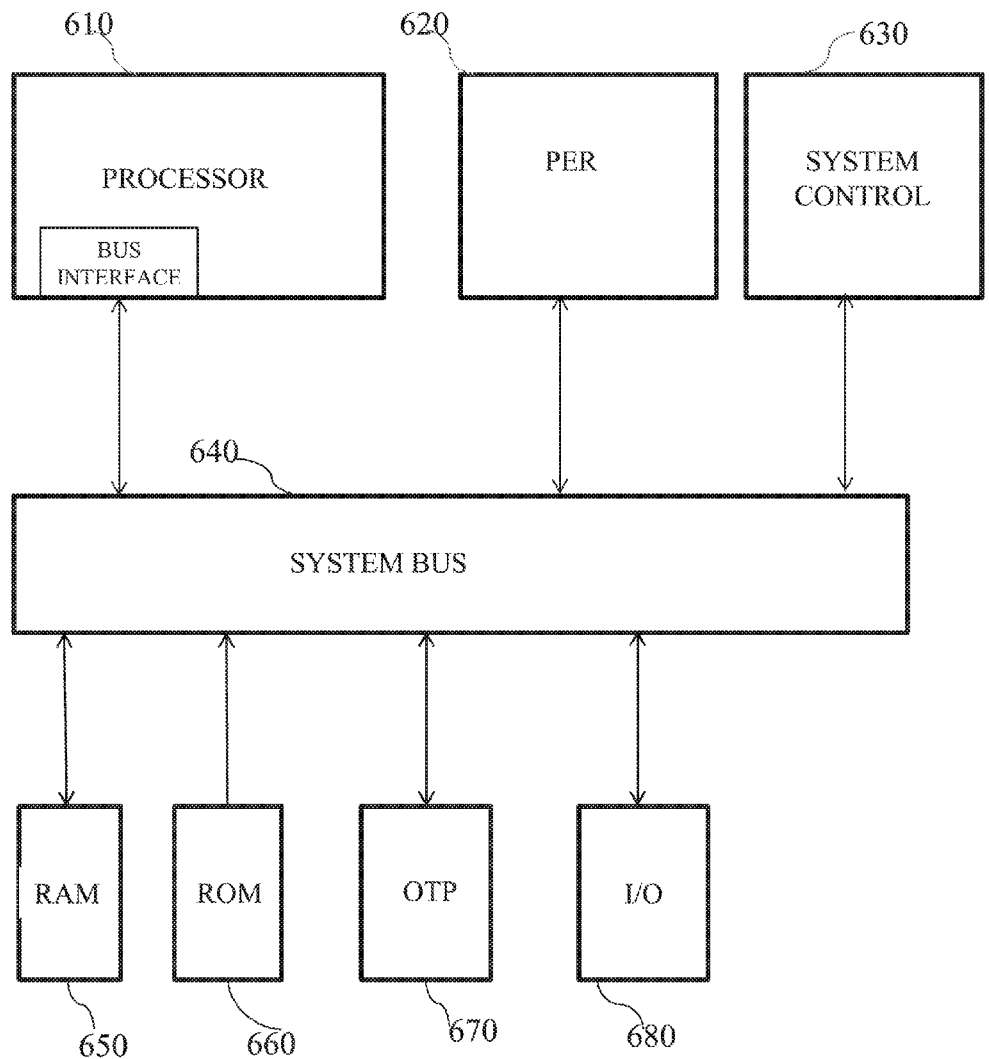
FIG. 12 illustrates a system using embodiments of the present invention.

FIG. 12 illustrates a system using embodiments of the present invention.

The device array described in various embodiments may be used to form different types of memories in one or more embodiments. In one or more embodiments, the embodiments described in the present invention may be standalone memories or embedded memories, for example, within a system on chip architecture.

Embodiments of the present invention may be part of a system, which may include a processor 610, a peripheral device (PER) 620, a system control unit 630, a system bus 640, a random access memory (RAM) 650, a read only memory (ROM) 660, an one-time programmable memory (OTP) 670, and a input/output (I/O) device 680.

The various components of the system may communicate through the system bus 640. The peripheral devices such as PER 620 may include many different types of devices including displays, keyboard, mouse, sensors, camera, and others. The I/O devices such as the I/O 680 may include transmitter and receivers for receiving wired or wireless communications.

In various embodiments, the PER 620, the RAM 650, the ROM 660, the OTP 670, and/or I/O 680 may include a memory cell as described in various embodiments of the present invention. Further, the processor 610, system control unit 630 may also include resistive switching devices, for example, as embedded memory, as described in various embodiments of the present invention.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. As an illustration, the embodiments described in FIGS. 1-9 may be combined with each other in alternative embodiments. It is therefore intended that the appended claims encompass any such modifications or embodiments.

Although the present invention and its advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a resistive switching device, the method comprising:
   forming a first insulating layer over a substrate;
   forming a first electrode in the first insulating layer;
   forming a oxide layer over the first electrode;
   forming a tellurium layer over and contacting the oxide layer, wherein the tellurium layer formed over the oxide layer comprises a Group IV element, wherein the Group IV element comprises titanium, zirconium, or hafnium, wherein the tellurium layer with the Group IV element is separated from the first electrode by the oxide layer; and forming a second electrode disposed over and contacting the tellurium layer.

2. The method of claim 1, wherein the second electrode comprises less than 5% of copper and silver.

3. The method of claim 1, further comprising forming a third electrode on the second electrode.

4. The method of claim 1, wherein the total amount of tellurium by atomic percent in the tellurium layer is 25% to 70%.

5. The method of claim 1, wherein forming a tellurium layer comprises co-sputtering tellurium with the group IV element, wherein the group IV element comprises titanium, zirconium, or hafnium.

6. The method of claim 5, wherein the co-sputtering uses different sources for the tellurium and the group IV element.

7. The method of claim 1, wherein forming a tellurium layer comprises sputtering using a common source for the tellurium and the group IV element.

8. The method of claim 1, wherein forming a tellurium layer comprises depositing an amorphous layer.

9. The method of claim 1, wherein forming a tellurium layer comprises depositing a layer comprising tellurium and a layer comprising the group IV element, and repeating the depositing to form a super lattice stack.

10. The method of claim 9, further comprising annealing the super lattice stack.

11. The method of claim 1, wherein the tellurium layer comprises 0.1 ppm to 1000 ppm of copper and silver.

12. The method of claim 1, wherein the oxide layer comprises a metal.

13. A method of forming a resistive switching device, the method comprising:

forming a first insulating layer over a substrate;
forming a first electrode in the first insulating layer;
forming a oxide layer over the first electrode;
forming a tellurium layer over and contacting the oxide layer, wherein the tellurium layer comprises less than 0.01% of copper and silver; and
forming a second electrode disposed over and contacting the tellurium layer, wherein forming a tellurium layer comprises depositing a crystalline layer and amorphising the crystalline layer using implantation.

14. The method of claim 1, wherein forming a tellurium layer comprises depositing a layer comprising tellurium and a layer comprising the group IV element.

15. The method of claim 14, further comprising annealing the tellurium layer to form an amorphous layer comprising tellurium and the group IV element.

16. A method of forming a resistive switching device, the method comprising:

forming a first electrode disposed over a substrate
forming a switching layer over the first electrode, the switching layer contacting the first electrode;
forming a conductive amorphous layer over and contacting the switching layer, wherein the conductive amorphous layer comprises tellurium or selenium and a Group IV element, wherein the Group IV element comprises titanium, zirconium, or hafnium, wherein the switching layer is configured to exhibit a first impedance in a first state of the resistive switching device and a second impedance in a second state of the resistive switching device, the second state being different from the first state, wherein the conductive amorphous layer comprises a substantially same impedance in the first state and the second state, wherein the switching layer separates the first electrode from the conductive amorphous layer with the Group IV element; and
forming a second electrode over the conductive amorphous layer, wherein the second electrode is disposed over and contacts the conductive amorphous layer.

17. The method of claim 16, wherein the first electrode is a metal silicide.

18. The method of claim 16, wherein the first electrode comprises tungsten, tantalum, or molybdenum.

19. The method of claim 16, wherein the conductive amorphous layer further comprises a transitional metal.

20. The method of claim 16, wherein the conductive amorphous layer further comprises a rare earth metal.

21. The method of claim 16, wherein the conductive amorphous layer comprises tellurium.

22. The method of claim 16, wherein the ratio of the number of Group IV element atoms to the number of tellurium atoms in the conductive amorphous layer is between 0.5:1 to 3:1.

23. The method of claim 16, wherein the switching layer comprises gadolinium oxide, aluminum oxide, hafnium oxide, zirconium oxide, silicon oxide, or mixtures thereof.

24. The method of claim 16, wherein the conductive amorphous layer comprises less than 0.01% of copper and silver, wherein the second electrode comprises less than 5% of copper and silver, wherein the switching layer comprises less than 0.01% of copper and silver.

25. The method of claim 16, wherein the conductive amorphous layer comprises selenium.

26. The method of claim 16, wherein the second electrode comprises an element selected from tantalum, tungsten, and molybdenum.

27. The method of claim 16, wherein the conductive amorphous layer comprises 0.1 ppm to 1000 ppm of copper and silver.

* * * * *